(12) United States Patent  
Kim

(10) Patent No.: US 9,634,118 B2  
(45) Date of Patent: Apr. 25, 2017

(54) METHODS OF FORMING SEMICONDUCTOR DEVICES

(71) Applicant: Samsung Electronics Co., Ltd., Suwon-si, Gyeonggi-do (KR)

(72) Inventor: Ju-Youn Kim, Suwon-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/164,160

(22) Filed: May 25, 2016

(65) Prior Publication Data

US 2017/0053996 A1    Feb. 23, 2017

(30) Foreign Application Priority Data

Aug. 20, 2015 (KR) .................. 10-2015-0117025

(51) Int. Cl.
| | |
|---|---|
| *H01L 21/8236* | (2006.01) |
| *H01L 21/8238* | (2006.01) |
| *H01L 29/66* | (2006.01) |
| *H01L 29/49* | (2006.01) |

(52) U.S. Cl.
CPC .... *H01L 29/66545* (2013.01); *H01L 21/8236* (2013.01); *H01L 21/823842* (2013.01); *H01L 29/4958* (2013.01)

(58) Field of Classification Search
None
See application file for complete search history.

(56) References Cited

U.S. PATENT DOCUMENTS

| | | | |
|---|---|---|---|
| 7,691,690 B2 | 4/2010 | Zhu et al. | |
| 7,795,682 B2 | 9/2010 | Kaneko et al. | |
| 7,960,287 B2 | 6/2011 | Johnson et al. | |
| 8,174,058 B2 | 5/2012 | Marshall et al. | |
| 8,722,473 B2 | 5/2014 | Schulz et al. | |
| 8,889,540 B2 | 11/2014 | Basker et al. | |
| 8,896,030 B2 | 11/2014 | Mukherjee et al. | |
| 8,963,257 B2 | 2/2015 | Wann et al. | |
| 8,975,141 B2 | 3/2015 | Wei et al. | |
| 2006/0263961 A1 | 11/2006 | Kittl et al. | |
| 2012/0104509 A1* | 5/2012 | Matsumoto | ..... H01L 21/823814 257/369 |
| 2013/0260549 A1* | 10/2013 | Jagannathan | ..... H01L 21/28518 438/592 |
| 2013/0277748 A1 | 10/2013 | Lee et al. | |

(Continued)

*Primary Examiner* — Asok K Sarkar
(74) *Attorney, Agent, or Firm* — Myers Bigel, P.A.

(57) ABSTRACT

Methods of forming semiconductor devices are provided. A method of forming a semiconductor device includes forming first and second dielectric layers in first and second trenches. The method includes forming first and second conductive layers on the first and second dielectric layers, respectively. The method includes forming first and second protective layers on the first and second conductive layers, respectively. The method includes performing an annealing process while the first and second protective layers are on the first and second conductive layers. The method includes removing the first and second protective layers. The method includes removing the first conductive layer, after performing the annealing process. Moreover, the method includes forming first and second gate metals in the first and second trenches, respectively, after removing the first conductive layer.

20 Claims, 35 Drawing Sheets

(56) References Cited

U.S. PATENT DOCUMENTS

| | | | |
|---|---|---|---|
| 2015/0021699 A1 | 1/2015 | Ando et al. | |
| 2015/0069525 A1 | 3/2015 | Adams et al. | |
| 2015/0079776 A1 | 3/2015 | Mukherjee et al. | |
| 2015/0187763 A1* | 7/2015 | Kim | H01L 27/088 257/392 |
| 2015/0270177 A1* | 9/2015 | Tseng | H01L 21/823857 438/216 |
| 2015/0287645 A1* | 10/2015 | Zhao | H01L 21/82 438/200 |
| 2015/0380407 A1* | 12/2015 | Ji | H01L 27/0922 257/369 |
| 2016/0086860 A1* | 3/2016 | Kannan | H01L 21/823842 438/592 |
| 2016/0093617 A1* | 3/2016 | Park | H01L 27/0922 257/369 |
| 2016/0190015 A1* | 6/2016 | Ando | H01L 21/32133 438/589 |

* cited by examiner

1400

METHODS OF FORMING SEMICONDUCTOR DEVICES

This U.S. non-provisional patent application claims priority under 35 U.S.C. §119 to Korean Patent Application No. 10-2015-0117025, filed on Aug. 20, 2015, in the Korean Intellectual Property Office, the disclosure of which is hereby incorporated herein by reference in its entirety.

BACKGROUND

The present disclosure relates to semiconductor devices. A semiconductor device may include transistors having different threshold voltages. Examples of such transistors in a semiconductor device may include a logic transistor, a static random access memory (SRAM) transistor, a dynamic random access memory (DRAM) transistor, or a combination thereof.

SUMMARY

Recently, various approaches have been made to develop methods for adjusting the threshold voltages of transistors included in a semiconductor device. Moreover, various embodiments of the present disclosure provide a method for fabricating a semiconductor device by which threshold voltages of transistors can be adjusted. This and other aspects, embodiments, and advantages of the present disclosure will be understood by those of ordinary skill in the art upon review of the Detailed Description and Claims to follow. Particulars in the example embodiments of the present disclosure will be described in the Detailed Description with reference to the accompanying drawings.

According to some example embodiments of the present disclosure, a method for fabricating a semiconductor device may include forming an interlayer insulation film on a substrate. The interlayer insulation film includes a first trench therein and a second trench therein, and the first and second trenches are spaced apart from each other. The method includes conformally forming a first dielectric film in the first trench and a second dielectric film in the second trench. The method includes forming a first conductive film on the first dielectric film and a second conductive film on the second dielectric film. The method includes forming a first shield film on the first conductive film and a second shield film on the second conductive film. The method includes performing annealing after the forming of the first and second shield films. The method includes removing the first and second shield films and the first conductive film after performing the annealing. The method includes forming a third conductive film on the first dielectric film and a fourth conductive film on the second conductive film. Moreover, the method includes forming a first gate metal on the third conductive film and a second gate metal on the fourth conductive film.

In some embodiments, the first to fourth conductive films may include Titanium Nitride (TiN) films. In some embodiments, forming the first gate metal may include sequentially stacking a first work function tuning film, a first barrier film, and a first metal film, forming the second gate metal may include sequentially stacking a second work function tuning film, a second barrier film, and a second metal film. In some embodiments, the first work function tuning film may contact the third conductive film, and the second work function tuning film may contact the fourth conductive film. Moreover, the first and second gate metals may be free of lanthanum (La) and free of tantalum nitride (TaN).

According to some embodiments, the method may include forming a first interface film on the substrate in the first trench and a second interface film on the substrate in the second trench, before the forming of the first and second dielectric films. Additionally or alternatively, the removing of the first and second shield films and the first conductive film may include removing at least a portion of the first conductive film after removing the first and second shield films.

In some embodiments, the method may include forming first and second fins on the substrate. The first and second fins may extend in a first direction and have different width. Moreover, the forming of the interlayer insulation film may include forming the first trench on the first fin and the second trench on the second fin. Additionally or alternatively, the forming of the first and second shield films may include forming the first and second shield films to fill the first and second trenches, respectively.

A method for fabricating a semiconductor device, according to some embodiments, may include forming first to fourth dielectric films in first to fourth regions of a substrate, respectively. The method may include forming first to fourth conductive films on the first to fourth dielectric films, respectively. The method may include forming first to fourth shield films on the first to fourth conductive films, respectively. The method may include performing annealing after the forming of the first to fourth shield films. The method may include removing the first to fourth shield films and the fourth conductive film to expose the fourth dielectric film, after performing the annealing. The method may include forming fifth to eighth conductive films on the first to third conductive films and the fourth dielectric film, respectively. The method may include removing the second and sixth conductive films to expose the second dielectric film. The method may include forming ninth to twelfth conductive films on the fifth conductive film, the second dielectric film, the seventh conductive film, and the eighth conductive film, respectively. The method may include removing the first, fifth, and ninth conductive films to expose the first dielectric film. The method may include forming thirteenth to sixteenth conductive films on the first dielectric film and the tenth to twelfth conductive films, respectively. Moreover, the method may include forming first to fourth gate metals on the thirteenth to sixteenth conductive films, respectively.

In some embodiments, forming the first gate metal may include sequentially stacking a first work function tuning film, a first barrier film, and a first metal film. Forming the second gate metal may include sequentially stacking a second work function tuning film, a second barrier film, and a second metal film. Forming the third gate metal may include sequentially stacking a third work function tuning film, a third barrier film, and a third metal film. Moreover, forming the fourth gate metal may include sequentially stacking a fourth work function tuning film, a fourth barrier film, and a fourth metal film.

According to some embodiments, the first work function tuning film may contact the thirteenth conductive film. The second work function tuning film may contact the fourteenth conductive film. The third work function tuning film may contact the fifteenth conductive film. Moreover, the fourth work function tuning film may contact the sixteenth conductive film.

In some embodiments, the first to fourth dielectric films may be free of lanthanum (La) thereon and may be free of tantalum nitride (TaN) thereon. In some embodiments, first to fourth transistors having different threshold voltages may be in the first to fourth regions, respectively. The first and second transistors may be NMOS transistors, and the third and fourth transistors may be PMOS transistors. Moreover, the threshold voltage of the first transistor may be lower than the threshold voltage of the second transistor, and the threshold voltage of the third transistor may be lower than the threshold voltage of the fourth transistor.

A method of forming a semiconductor device, according to some embodiments, may include conformally forming first and second dielectric layers in first and second trenches, respectively, of an interlayer insulator. The method may include conformally forming first and second conductive layers on the first and second dielectric layers, respectively. The method may include forming first and second protective layers on the first and second conductive layers, respectively. The method may include performing an annealing process while the first and second protective layers are on the first and second conductive layers. The method may include removing the first and second protective layers. The method may include removing the first conductive layer, after performing the annealing process. Moreover, the method may include forming first and second gate metals in the first and second trenches, respectively, after removing the first conductive layer.

In some embodiments, the method may include conformally forming third and fourth conductive layers on the first dielectric layer and the second conductive layer, respectively, after removing the first conductive layer. In some embodiments, removing the first and second protective layers may include exposing the first and second conductive layers, and removing the first conductive layer may include exposing the first dielectric layer. Moreover, forming the first and second gate metals may include forming the first and second gate metals on the third and fourth conductive layers, respectively. In some embodiments, a first transistor may include the first gate metal and the third conductive layer, a second transistor may include the second gate metal and the second and fourth conductive layers, and a first thickness of the third conductive layer of the first transistor may be thinner than a combined second thickness of the second and fourth conductive layers of the second transistor.

According to some embodiments, forming the first and second gate metals may include forming the first and second gate metals to be Lanthanum-free and Tantalum Nitride-free.

Other features and example embodiments will be apparent from the following detailed description, the drawings, and the claims.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

DETAILED DESCRIPTION

Figure 1:
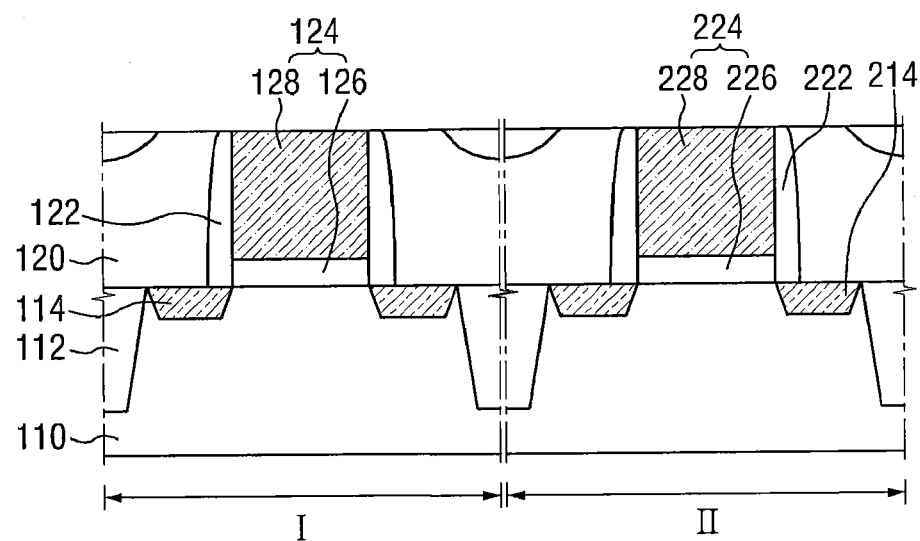
FIGS. 1 to 9 are cross-sectional views for illustrating a method for fabricating a semiconductor device according to some example embodiments of the present disclosure.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, a method for fabricating a semiconductor device according to some example embodiments of the present disclosure will be described with reference to FIGS. 1 to 9. FIGS. 1 to 9 are cross-sectional views for illustrating a method for fabricating a semiconductor device according to some example embodiments of the present disclosure.

Referring to FIG. 1, a substrate 110 is prepared. The substrate 110 may include a first region I and a second region II. The first region I and the second region II may be adjacent to each other or may be separated from each other. For example, the first region I may be a NFET region where an n-type transistor is formed, while the second region II may be a PFET region where a p-type transistor is formed.

An active region is defined by forming a device separating film 112 such as a shallow trench isolation (STI). The substrate 110 may be made of at least one semiconductor material selected from the group including Silicon (Si), Germanium (Ge), Silicon Germanium (SiGe), Gallium Phosphide (GaP), Gallium Arsenide (GaAs), Silicon Carbide (SiC), Silicon-Germanium-Carbon (SiGeC), Indium Arsenide (InAs), and Indium Phosphide (InP). In addition, a silicon-on-insulator (SOI) substrate may be used.

Subsequently, a first dummy gate feature 124 is formed in the first region I, and a second dummy gate feature 224 is formed in the second region II. The first and second dummy gate features (e.g., dummy gate structures) 124 and 224 may include first and second dummy gate insulation films 126 and 226 and first and second dummy gate electrodes 128 and 228, respectively. The first and second dummy gate insulating films 126 and 226 may be formed on the substrate 110 and may be silicon oxide films. The first and second dummy gate electrodes 128 and 228 may be formed on the first and second dummy gate insulation films 126 and 226, respectively. The first and second dummy gate electrodes 128 and 228 may include, for example, polysilicon.

Subsequently, first source/drain regions 114 and second source/drain regions 214 are formed in the substrate 110 using the first and second dummy gate features 124 and 224 as masks, respectively. The first source/drain regions 114 are formed in the first region I, and the second source/drain regions 214 are formed in the second region II. The first and second source/drain regions 114, 214 may be formed on at least one side of the first and second dummy gate features 124 and 224, respectively. Specifically, the first source/drain regions 114 may be formed between the device separating film 112 and the first dummy gate feature 124, and the second source/drain regions 214 may be formed between the device separating film 112 and the first dummy gate feature 224. A channel region is formed under the first dummy gate feature 124, via which n-type carriers included in the first source/drain regions 114 may travel. A channel region is formed under the second dummy gate feature 224, via which p-type carriers included in the second source/drain regions 214 may travel.

First and second spacers 122 and 222 may be formed on side walls of each of the first and second dummy gate features 124 and 224, respectively. The first and second spacers 122 and 222 may include, for example, silicon oxide or silicon nitride. The first and second spacers 122 and 222 may be formed on the side walls of each of the first and second gate features 124 and 224, respectively, in such a manner that a spacer film is formed by a CVD process and is then etched back. The shape of the first and second spacers 122 and 224 is not limited to that shown in FIG. 1.

Subsequently, an interlayer insulation film (e.g., an interlayer insulator) 120 is formed on the substrate 110. The interlayer insulation film 120 may cover the spacers 122 and 222 formed on the side walls and expose the top surfaces of the first and second dummy gate features 124 and 224. In order to expose the top surfaces of the first and second dummy gate features 124 and 224, a planarization process may be performed after forming the interlayer insulation film 120. The interlayer insulation film 120 may be formed by stacking two or more insulation films, unlike that shown in FIG. 1.

Figure 2:
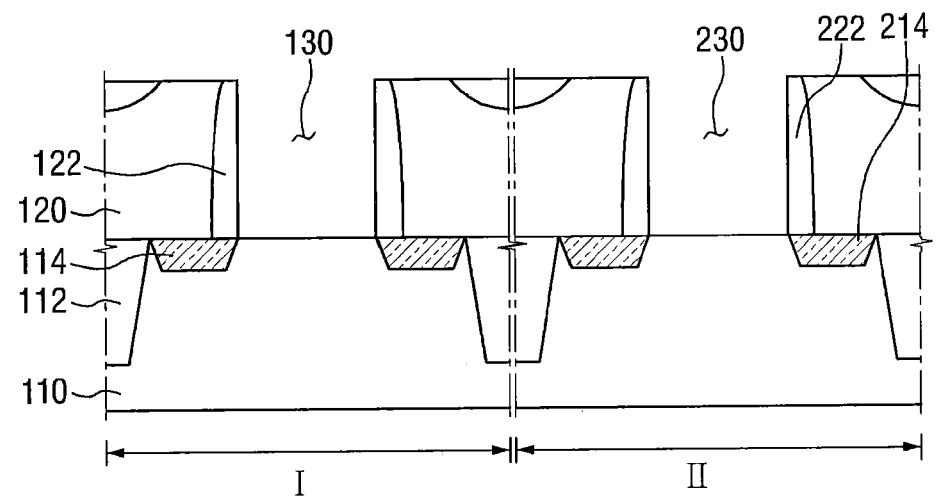

Referring to FIG. 2, the interlayer insulation film 120 is formed that includes a first trench 130 formed in the first region I and a second trench 230 formed in the second region II. The first trench 130 may be formed by removing the first dummy gate feature 124, and the second trench 230 may be formed by removing the second dummy gate feature 224.

The first trench 130 may expose side walls of the first spacers 122 and the top surface of the substrate 110, and the second trench 230 may expose side walls of the second spacer 222 and the top surface of the substrate 110.

Figure 3:
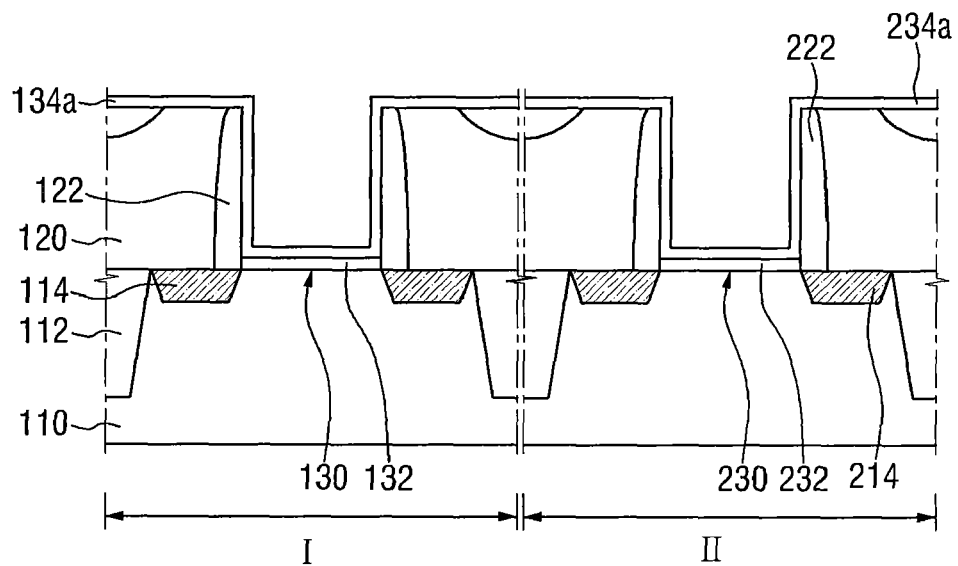

Referring to FIG. 3, a first interface film 132 is formed on the top surface of the substrate 110 in the first trench 130, and a second interface film 232 is formed on the top surface of the substrate 110 in the second trench 230.

The first and second interface films 132 and 232 may be formed by, but are not limited to, oxidizing the exposed top surface of the substrate 110 in the first and second trenches 130 and 230, respectively. The first and second interface films 132 and 232 may be formed along the bottom surfaces of the first and second trenches 130 and 230, respectively. The first and second interface films 132 and 232 may improve/prevent a poor interface between the substrate 110 and first and second dielectric films 134a and 234a, respectively. The first and second interface films 132 and 232 may include a low-k material layer having a dielectric permittivity k below 9, for example, a silicon oxide film having a value of k of about 4, or a silicon oxynitride film having a value of k of about 4 to 8, depending on the quantities/concentrations of oxygen atoms and nitrogen atoms. Alternatively, the first and second interface films 132 and 232 may be made of silicate, or may be made of a combination of the above-listed films.

Subsequently, the first dielectric film (e.g., dielectric/insulating layer) 134a is formed in the first trench 130, and the second dielectric film (e.g., dielectric/insulating layer) 234a is formed in the second trench 230. Specifically, the first dielectric film 134a may be formed such that it conforms to the side walls and the bottom surface of the first trench 130, and the second dielectric film 234a may be formed such that it conforms to the side walls and the bottom surface of the second trench 230. In addition, the first and second dielectric films 134a and 234a may be formed on the interlayer insulation film 120 as well. The first and second dielectric films 134a and 234a may include a high-k material having a dielectric constant higher than that of a silicon oxide film. For example, the first and second dielectric films 134a and 234 a may include a material selected from the group including Hafnium Silicon Oxynitride (HfSiON), Hafnium Oxide (HfO$_2$), Zirconium Oxide (ZrO$_2$), Tantalum Pentoxide (Ta$_2$O$_5$), Titanium Dioxide (TiO$_2$), Strontium Titanate (SrTiO$_3$), and Barium-Strontium Titanate (Ba,Sr) TiO$_3$. The thickness of the first and second dielectric films 134a and 234a may be determined depending on the type of device to be formed.

Figure 4:
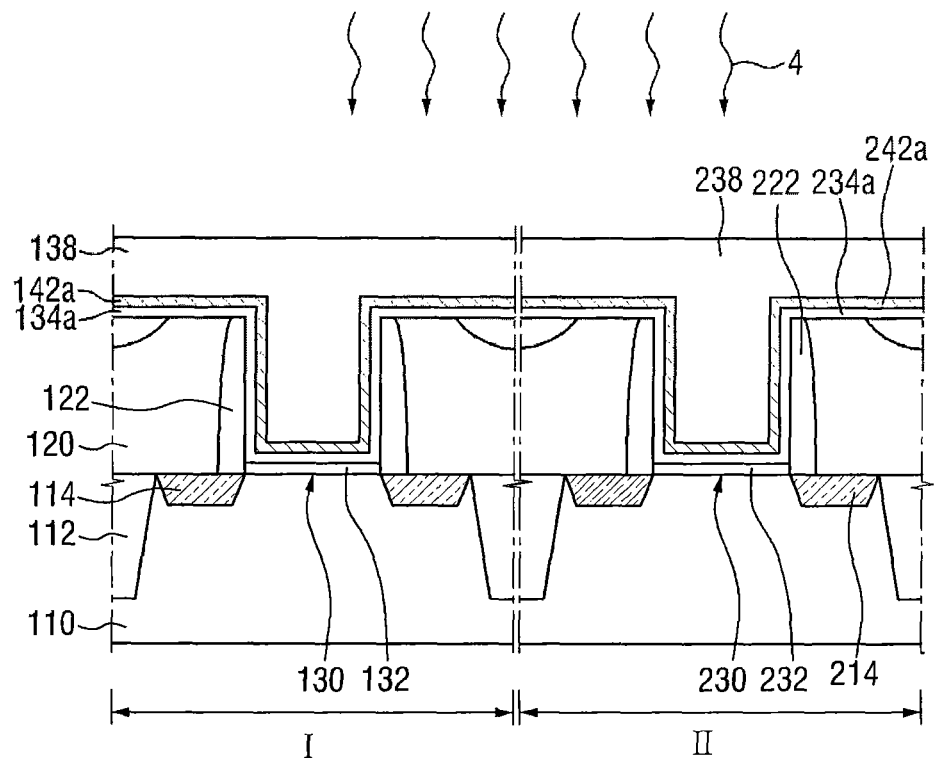

Referring to FIG. 4, first and second conductive films (e.g., conductive layers) 142a and 242a are formed, and then first and second shield films 138 and 238 may be formed. The first conductive film 142a may be formed in the first trench 130, and the second conductive film 242a may be formed in the second trench 230. The first and second conductive films 142a and 242a may be formed such that they conform to the side walls and the bottom surfaces of the first and second trenches 130 and 230, respectively. The first and second conductive films 142a and 242a may include a nitride. For example, the first and second conductive films 142a and 242a may include Titanium Aluminum Nitride (TiAlN) and/or Titanium Nitride (TiN). As an example, the first and second conductive films 142a and 242a in FIG. 4 may include TiN.

Subsequently, the first and second shield films (e.g., protective layers/films) 138 and 238 may be formed on the first and second conductive films 142a and 242a, respectively. The first and second trenches 130 and 230 may be filled with the first and second shield films 138 and 238, respectively, so that the first and second conductive films 142a and 242a are not exposed. The first and second shield films 138 and 238 may include, for example, Si, and may be an oxide or a nitride.

Subsequently, an annealing process 4 is performed. The first and second dielectric films 134a and 234a include oxygen atoms. The oxygen atoms are bonded to other substances such as Hf, Zr, Ta, Ti, etc. Some of the bonds between the oxygen atoms and other substances may be broken. When the bonds are broken, leakage current may occur, so that the performance of a transistor may deteriorate. To reduce/prevent this problem, an annealing process is performed to bond oxygen atoms to a broken bond. By performing the annealing process 4, the oxygen atoms included in the first and second conductive films 142a and 242a are provided into the first and second dielectric films 134a and 234a, respectively.

If the first and second conductive films 142a and 242a are exposed when the annealing process 4 is performed, external oxygen atoms permeate into the first and second conductive films 142a and 242a, so that the quantity/number of oxygen atoms traveling below the first and second conductive films 142a and 242a increases. If the oxygen atoms are supplied more than required by the first and second dielectric films 134a and 234a, excess oxygen atoms may react with the substrate 110 in the first and second trenches 130 and 230. As a result, the first and second interface films 132 and 232 become thicker, and the performance of a transistor may deteriorate. For this reason, the first and second conductive films 142a and 242a are isolated from the outside atmosphere at the time of performing the annealing process 4 by forming the first and second shield films 138 and 238 on the first and second conductive films 142a and 242a, respectively, and thus it is possible to appropriately adjust the amount of oxygen atoms supplied.

The annealing process 4 may be performed at a temperature between 500° C. and 1,500° C.

The thickness of the first and second conductive films 142a and 242a may vary depending on the quantity/number of oxygen atoms to be supplied.

Figure 5:
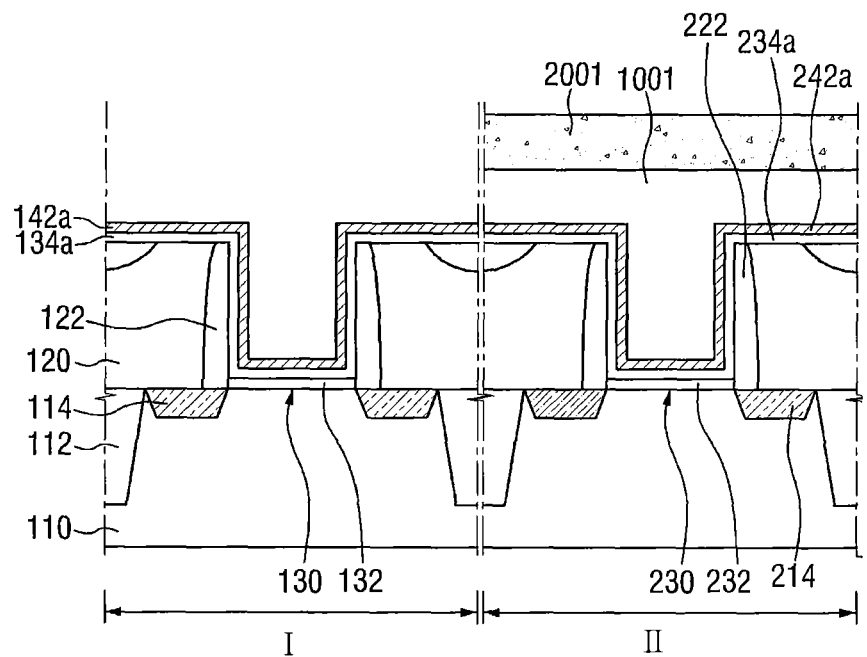

Referring to FIG. 5, the first and second shield films 138 and 238 are removed sequentially. Accordingly, the first and second conductive films 142a and 242a may be exposed again.

Subsequently, a first mask pattern 1001 and a first photosensitive film pattern 2001 are formed such that they cover the second conductive film 242a while exposing the first conductive film 142a. Specifically, a mask film is formed on the first and second conductive films 142a and 242a so as to fill the first and second trenches 130 and 230. The mask film may be formed on the top surface of the interlayer insulation film 120 as well.

The mask film may be a bottom anti-reflective coating (BARC) film. The mask film may include a material exhibiting a good gap-fill property so that the first and second trenches 130 and 230 can be filled with the mask film. The mask film may be formed in direct contact with the first and second conductive films 142a and 242a, respectively.

Subsequently, the first photosensitive film pattern 2001 may be formed on the mask film. The first photosensitive film pattern 2001 exposes the mask film formed on the first conductive film 142a while it covers the mask film formed on the second conductive film 242a. That is, the first photosensitive film pattern 2001 covers the second region II while exposing the first region I.

Subsequently, the mask film with which the first trench 130 is filled is removed using the first photosensitive film pattern 2001 as a mask for an etching process, as shown in FIG. 5. By performing the etching process, the first mask pattern 1001 is formed on the second conductive film 242a. The second trench 230 is filled with the first mask pattern 1001.

In other words, in the first region I, the mask film formed on the first conductive film 142a is removed by the etching process, forming the first mask pattern 1001. The first conductive film 142a is exposed by virtue of the first mask pattern 1001. That is, while the first conductive film 142a is exposed, the second conductive film 242a is covered by the first mask pattern 1001 and the first photosensitive film pattern 2001. The first mask pattern 1001 and the first photosensitive film pattern 2001 formed on the second conductive film 242a form a stack of films, which may be used as an etch mask in a subsequent process.

The mask film with which the first trench 130 is filled may be removed by dry etching. The dry etching may be, for example, reactive ion etching (RIE).

Examples of the dry etching for forming the first mask pattern 1001 may include using a mixture gas (e.g., a gas mixture) including oxygen as an etching gas to etch the mask film with which the first trench 130 is filled. The mixture gas may include chlorine in addition to oxygen. The mixture gas may further include helium. Another example of the dry etching for forming the first mask pattern 1001 may include using a mixture gas including nitrogen and hydrogen as an etching gas to etch the mask film with which the first trench 130 is filled.

Figure 6:
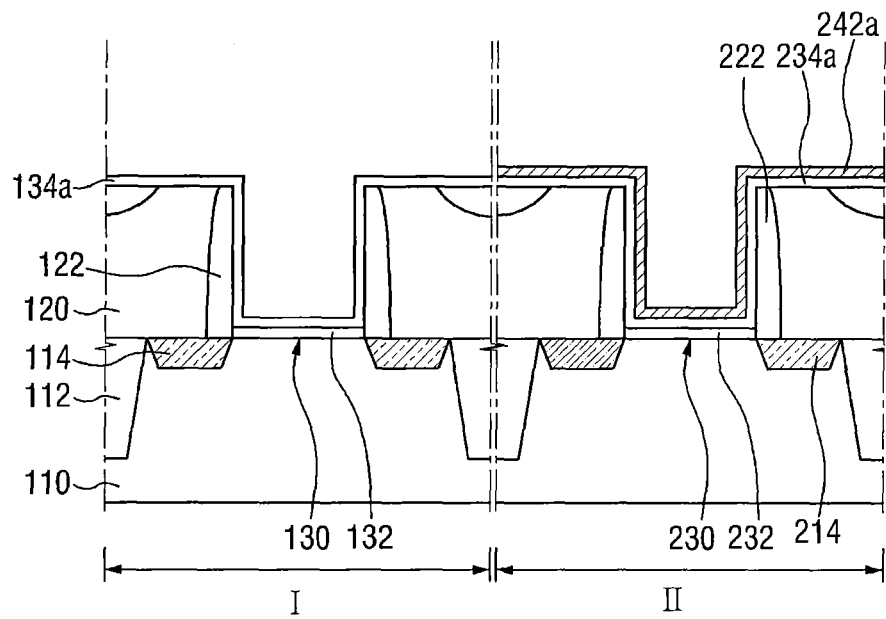

Referring to FIG. 6, the first conductive film 142a formed along the side walls and the bottom surface of the first trench 130 is removed by using the stack of films of the first mask pattern 1001 and the first photosensitive film pattern 2001 as an etch mask. As a result, the first dielectric film 134a may be exposed.

The first conductive film 142a may be removed by, for example, wet etching. An etchant used in the wet etching may include, but is not limited to, hydrogen peroxide ($H_2O_2$). The wet etching may be performed in order to reduce damage to the first dielectric film 134a during the process of removing the first conductive film 142a, which first dielectric film 134a is to be exposed.

Subsequently, the first mask pattern 1001 and the first photosensitive film pattern 2001 formed on the second conductive film 242a may be removed. As the stack of films of the first mask pattern 1001 and the first photosensitive film pattern 2001 is removed, the second conductive film 242a is exposed.

For example, the first mask pattern 1001 and the first photosensitive film pattern 2001 may be ashed and stripped by using a gas including hydrogen $H_2$ and nitrogen $N_2$, for example.

Figure 7:
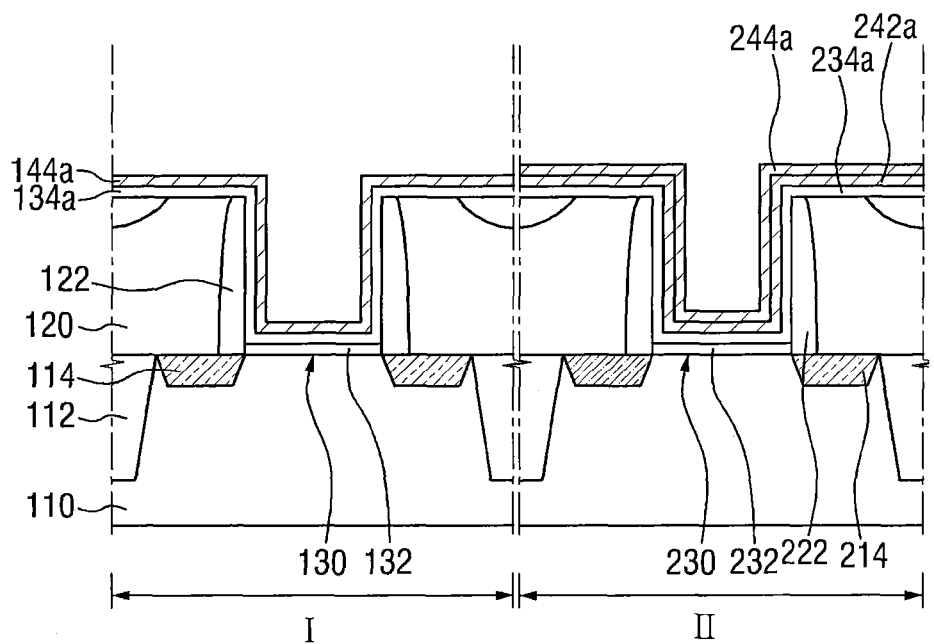

Subsequently, referring to FIG. 7, third and fourth conductive films (e.g., conductive layers) 144a and 244a may be formed on the first dielectric film 134a and the second conductive film 242a, respectively. The third and fourth conductive films 144a and 244a may be formed such that they conform to the side walls and the bottom surfaces of the first and second trenches 130 and 230, respectively. The third and fourth conductive films 144a and 244a may include a nitride. The third and fourth conductive films 144a and 244a may include TiAlN and/or TiN. In some example embodiments, the third and fourth conductive films 144a and 244a include TiN, for example.

Figure 8:
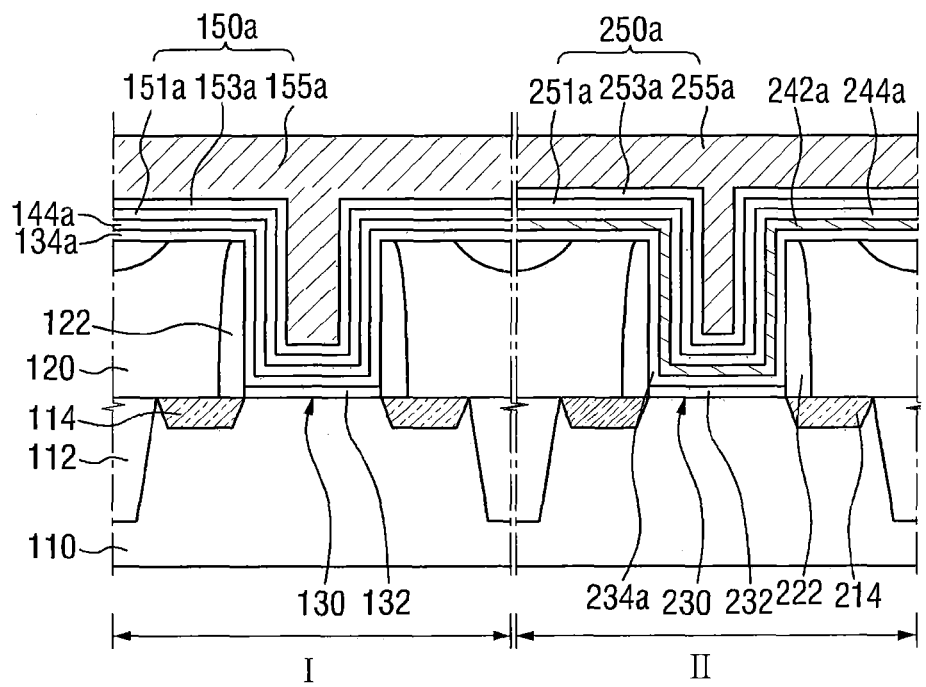

Subsequently, referring to FIG. 8, first and second gate metals 150a and 250a are formed in the first and second regions I and II, respectively. The first gate metal 150a may include a first work function tuning film 151a, a first barrier film 153a and a first metal film 155a. The second gate metal 250a may include a second work function tuning film 251a, a second barrier film 253a and a second metal film 255a.

Specifically, in order to form the first and second gate metals 150a and 250a in the first and second regions I and II, respectively, the first and second work function tuning films 151a and 251a may be formed in the first and second regions I and II, respectively. The first and second work function tuning films 151a and 251a may be formed such that they conform to the side walls and the bottom surfaces of the first and second trenches 130 and 230, respectively. The first and second work function tuning films 151a and 251a may include at least one of Titanium Aluminide (TiAl), TiAlN and Titanium Aluminum Carbide (TiAlC). In some example embodiments, the first and second work function tuning films 151a and 251a may include TiAlC.

Subsequently, the first and second barrier films 153a and 253a may be formed on the first and second work function tuning films 151a and 251a, respectively. Specifically, the first and second barrier films 153a and 253a may be formed such that they conform to the side walls and the bottom surfaces of the first and second trenches 130 and 230, respectively. The first and second barrier films 153a and 253a may include TiN, for example. The first and second barrier films 153a and 253a may impede/prevent a material included in the first and second metal films 155a and 255a from being diffused into the first and second trenches 130 and 230.

The first and second metal films 155a and 255a may be formed on the first and second barrier films 153a and 253a, respectively. The remaining portions of the first and second trenches 130 and 230 may be filled with the first and second metal films 155a and 255a, respectively. The first and second metal films 155a and 255a may include, for example, Aluminum (Al) or Tungsten (W).

Therefore, the first and second gate metals 150a and 250a may include neither lanthanum (La) nor tantalum nitride (TaN). And, neither lanthanum (La) nor tantalum nitride (TaN) is disposed on the first and second dielectric films 134a and 234a. In other words, the first and second gate metals 150a and 250a may be free of La therein and free of TaN therein, and the first and second dielectric films 134a and 234a may be free of La thereon and free of TaN thereon.

Figure 9:
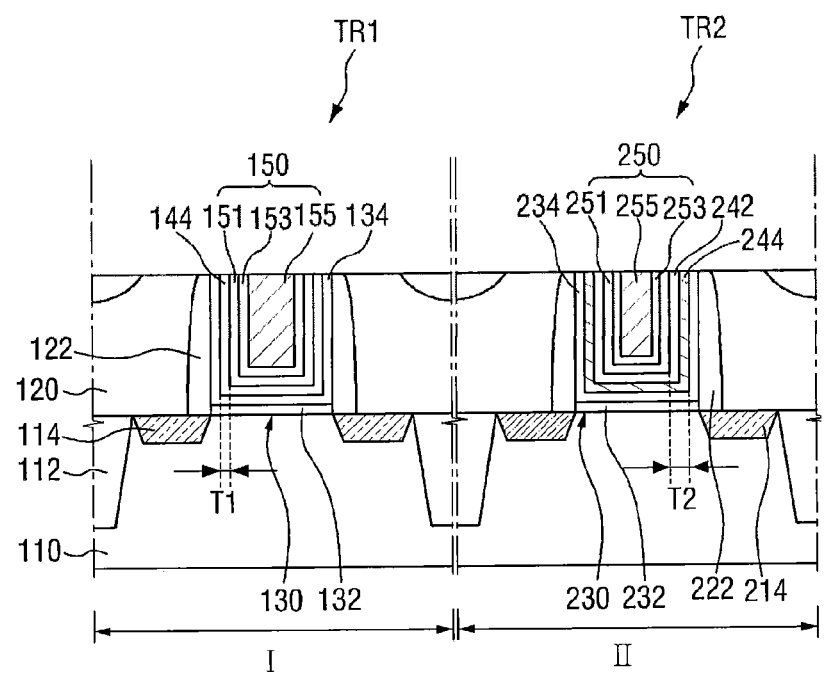

Subsequently, referring to FIG. 9, first and second transistors TR1 and TR2 may be formed.

By performing a planarizing process so that the interlayer insulation film 120 is exposed, the first transistor TR1 may be formed in the first region I of the substrate 110, which includes the first source/drain regions 114, the first spacer 122, the first interface film 132, the first dielectric film 134, the third conductive film 144 and the first gate metal 150. The first gate metal 150 may include a first work function tuning film 151, a first barrier film 153 and a first metal film 155. The first and second gate metals 150 and 250 may include neither lanthanum (La) nor tantalum nitride (TaN).

And, neither lanthanum (La) nor tantalum nitride (TaN) is disposed on the first and second dielectric films 134 and 234.

In addition, the second transistor TR2 may be formed in the second region II of the substrate 110, which includes the second source/drain regions 214, the second spacer 222, the second interface film 232, the second dielectric film 234, the second conductive film 242, the fourth conductive film 244, and the second gate metal 250. The second gate metal 250 may include a second work function tuning film 251, a second barrier film 253 and a second metal film 255. In some example embodiments, the thickness T1 of the third conductive film 144 of the first transistor TR1 may be different from the thickness T2 of the second conductive film 242 and the fourth conductive film 244 of the second transistor TR2. Accordingly, the threshold voltage of the first transistor TR1 may be different from the threshold voltage of the second transistor TR2.

Hereinafter, a method for fabricating a semiconductor device according to some example embodiments of the present disclosure will be described with reference to FIGS. 10 to 19.

A method according to some example embodiments may further include forming first and second finned active patterns (e.g., fins or fin patterns) on a substrate, in addition to the processes of the method(s) described above with respect to FIGS. 1 to 9. Like reference numerals denote like elements throughout the drawings, and descriptions of the identical elements may be omitted to avoid redundancy.

Figure 11:
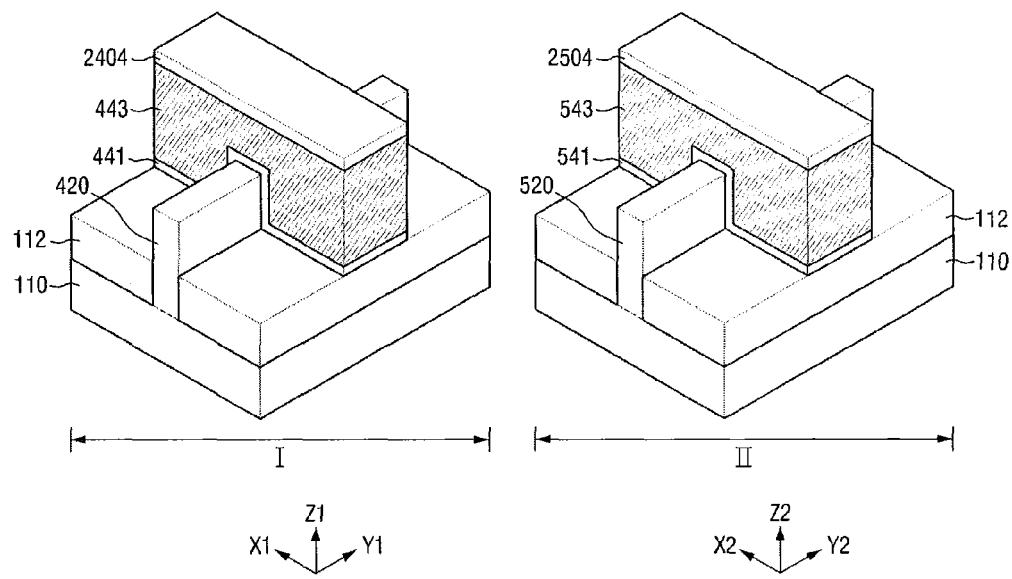
Figure 12:
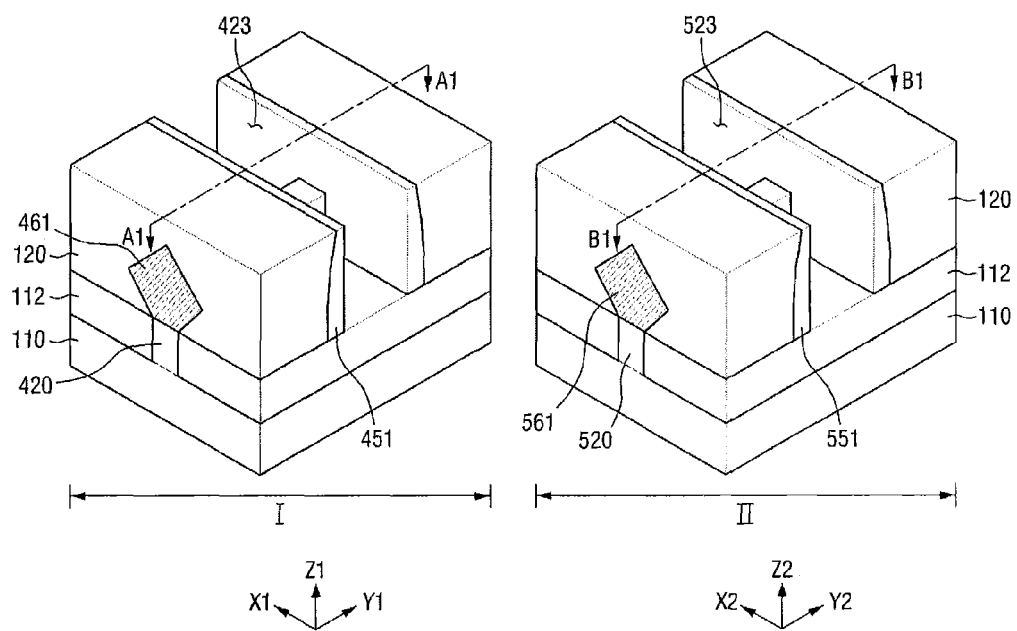
Figure 13:
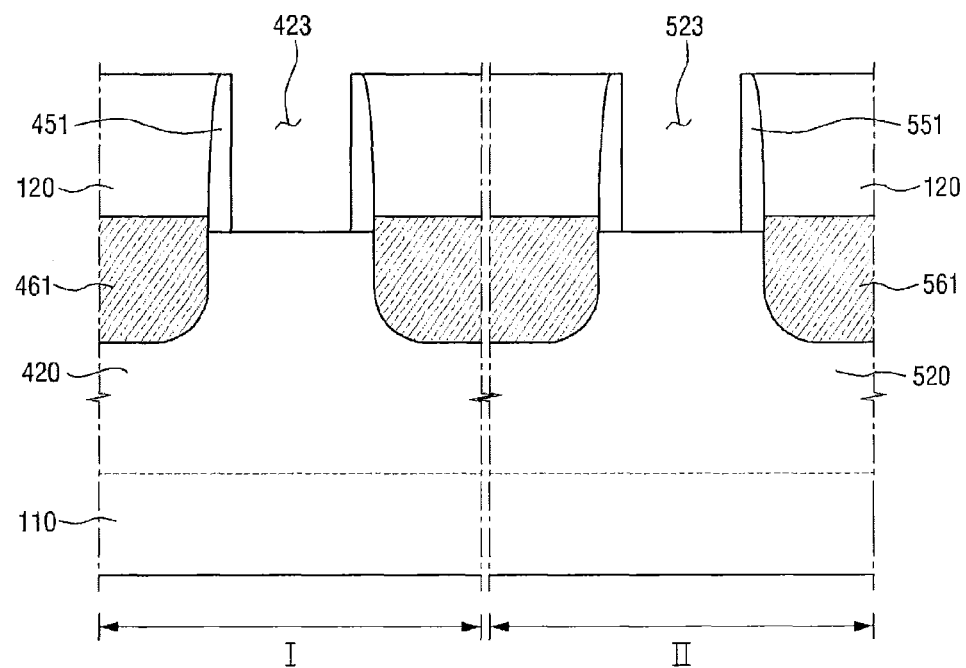
Figure 16:
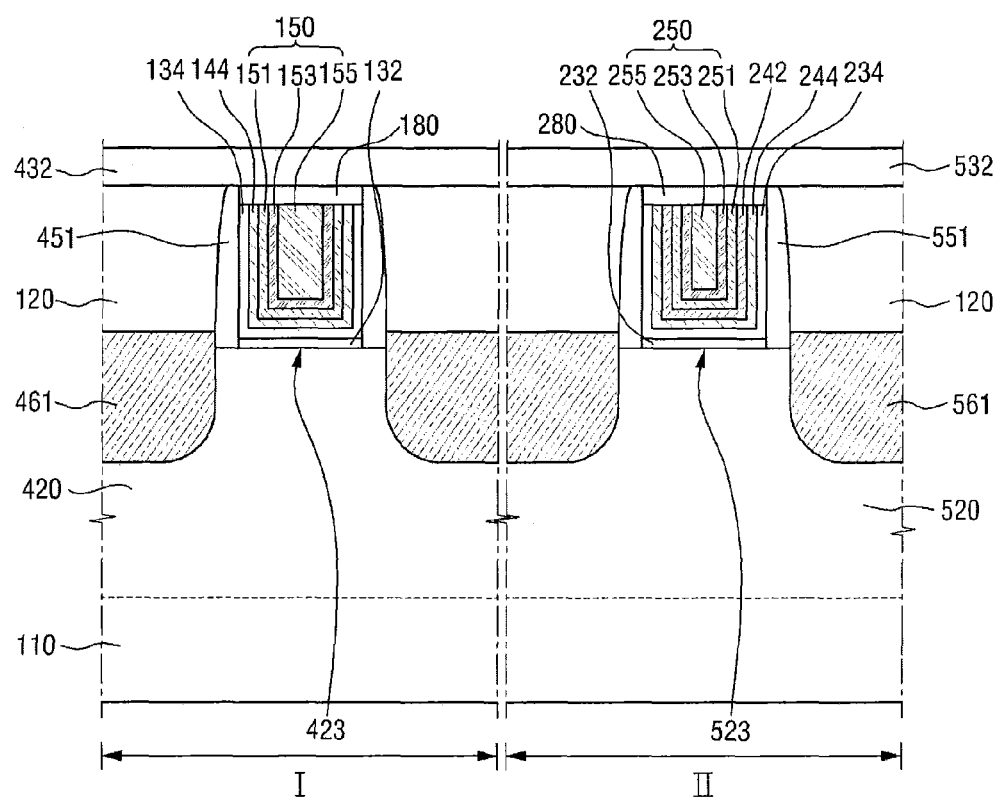
Figure 17:
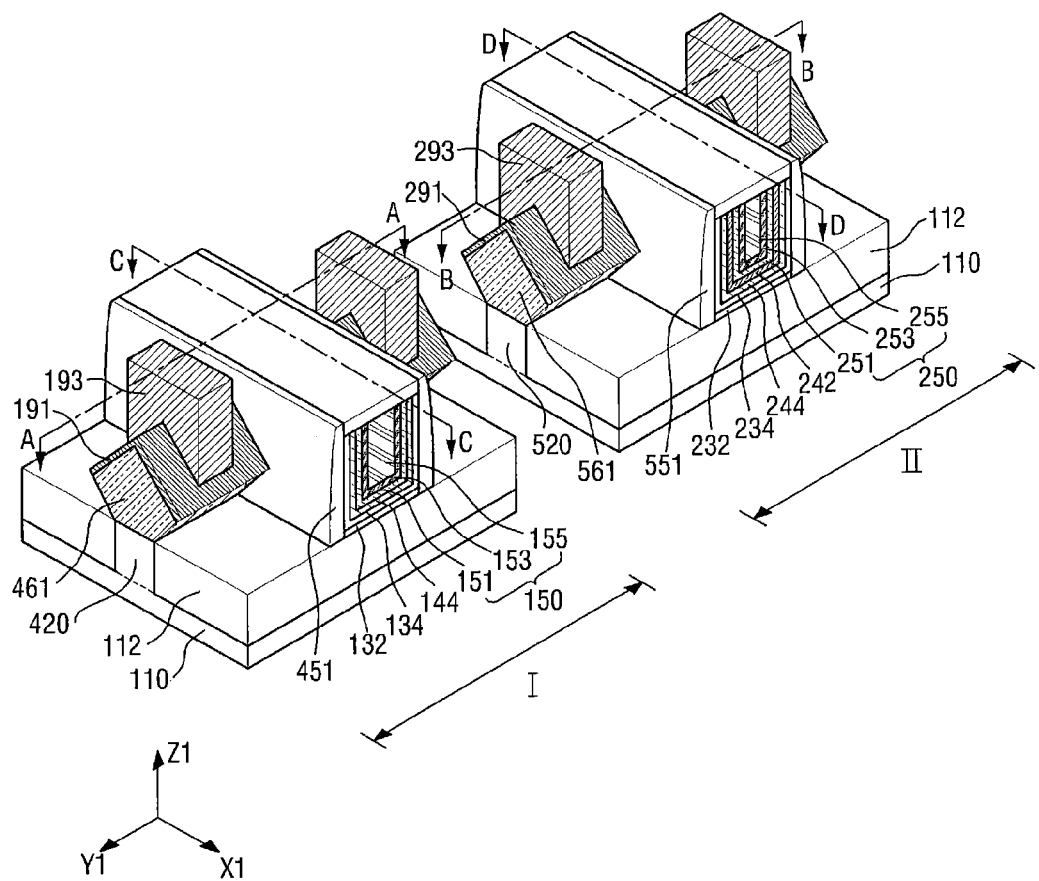
Figure 18:
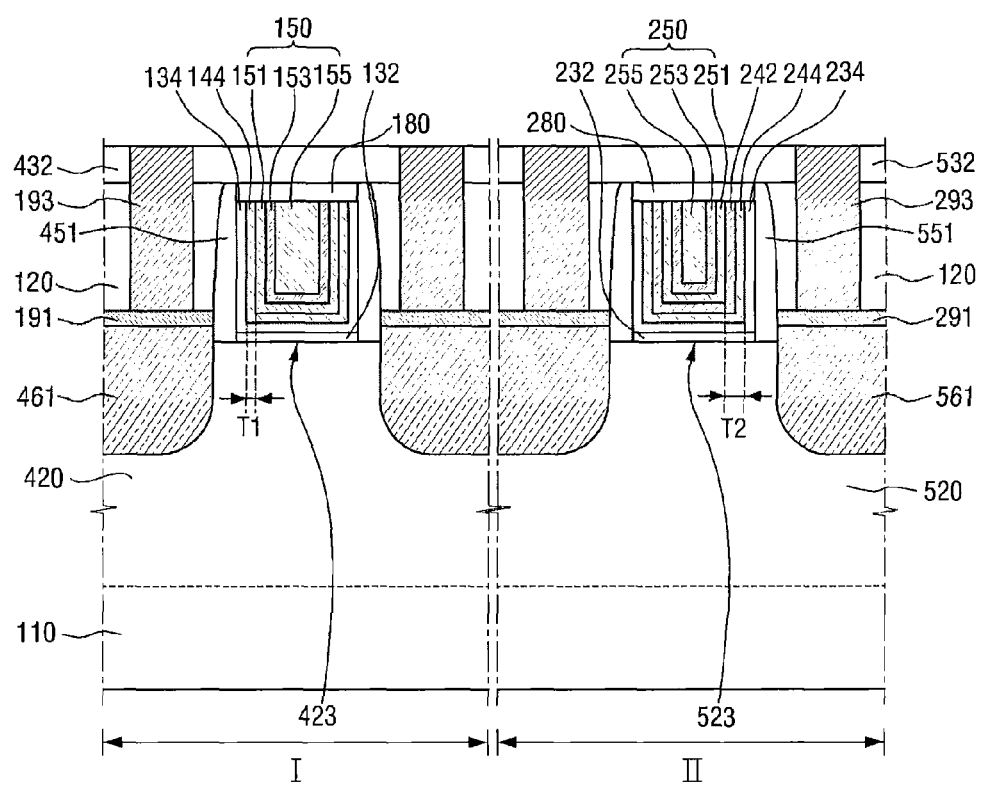
Figure 19:
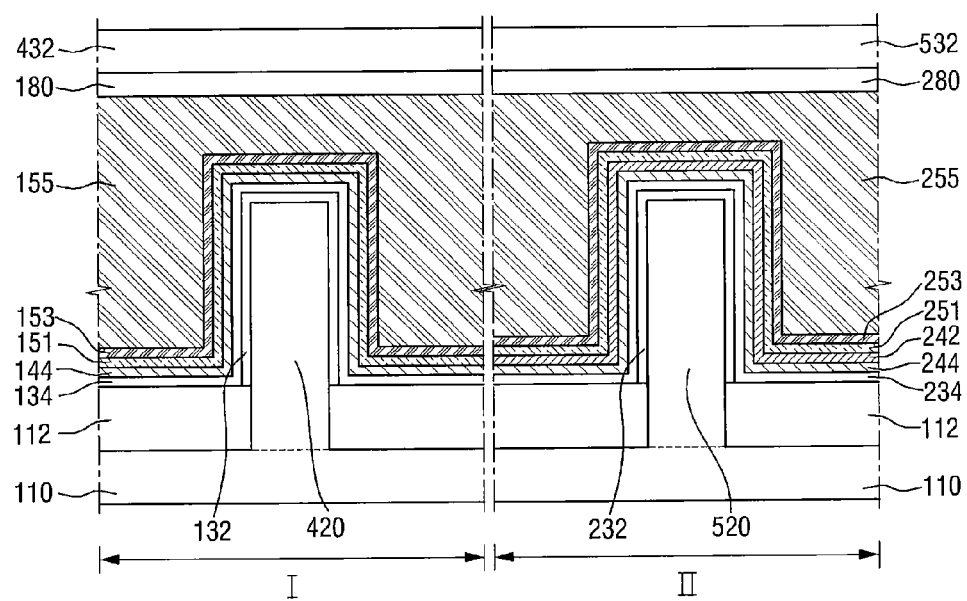

FIGS. 10 to 19 are views for illustrating processes (e.g., operations) of a method for fabricating a semiconductor device according to some example embodiments of the present disclosure. Specifically, FIGS. 10 to 12 and 17 are perspective views. FIG. 13 is a cross-sectional view taken along lines A1-A1 and B1-B1 of FIG. 12. FIG. 18 is a cross-sectional view taken along lines A-A and B-B of FIG. 17. FIG. 19 is a cross-sectional view taken along lines C-C and D-D of FIG. 17.

Figure 10:
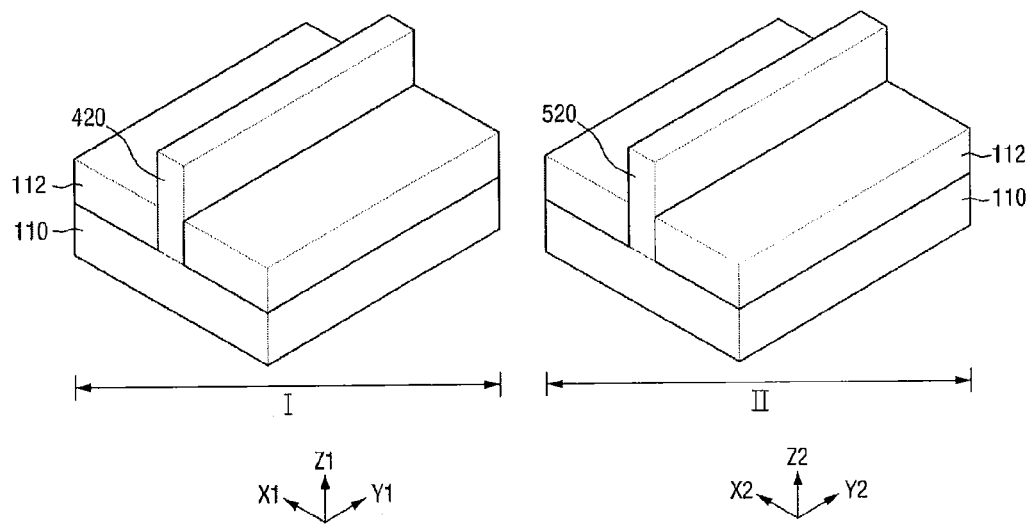
FIGS. 10 to 19 are views for illustrating processes of a method for fabricating a semiconductor device according to some example embodiments of the present disclosure.

Referring to FIG. 10, a first finned active pattern (e.g., fin or fin pattern) 420 and a second finned active pattern 520 are formed on a substrate 110. The first finned active pattern 420 is formed in a first region I, and the second finned active pattern 520 is formed in a second region II.

The first finned active pattern 420 and the second finned active pattern 520 may be extended in first directions Y1 and Y2. The first finned active pattern 420 and the second finned active pattern 520 may be a part of the substrate 110, and may include epitaxial layers grown on the substrate 110. A device separating film 112 may cover side surfaces of the first finned active pattern 420 and the second finned active pattern 520.

The first finned active pattern 420 and the second finned active pattern 520 may include, for example, elemental semiconductor materials such as silicon or germanium. In some embodiments, the first finned active pattern 420 and the second finned active pattern 520 may include compound semiconductors, for example, a group IV-IV compound semiconductor or a group III-V compound semiconductor. Specifically, as examples of a group IV-IV compound semiconductor, the first finned active pattern 420 and the second finned active pattern 520 may include a binary compound or ternary compound including at least two of carbon (C), silicon (Si), germanium (Ge) and tin (Sn), or such compounds doped with IV group element. As examples of a group III-V compound semiconductor, the first finned active pattern 420 may include a binary compound, ternary compound, or quaternary compound formed by bonding at least one of aluminum (Al), gallium (Ga) and indium (In) as a group III element and one of phosphorous (P), arsenic (As) and antimony (Sb) as a group V element.

Referring to FIG. 11, an etching process is performed using a first hard mask pattern 2404 and a second hard mask pattern 2504, such that a third dummy gate 443 intersecting the first finned active pattern 420 extending in a second direction X1, and a fourth dummy gate 543 intersecting the second finned active pattern 520 extending in a second direction X2, may be formed.

A third dummy gate dielectric film 441 is formed between the first finned active pattern 420 and the third dummy gate 443. A fourth dummy gate dielectric film 541 is formed between the second finned active pattern 520 and the fourth dummy gate 543.

The third dummy gate dielectric film 441 and the fourth dummy gate dielectric film 541 may include, for example, one of a silicon dioxide ($SiO_2$) film, a silicon oxynitride (SiON) film and a combination thereof. The third dummy gate 443 and the fourth dummy gate 543 may include, for example, one of poly silicon (poly Si), amorphous silicon (a-Si) and a combination thereof.

In a method for fabricating a semiconductor device according to some example embodiments, the third dummy gate dielectric film 441 and the fourth dummy gate dielectric film 541 may be formed together in the same process or may be formed separately in different processes. Accordingly, interface films and third and fourth gate dielectric films including a high-k material may be formed under the third dummy gate 443 and the fourth dummy gate 543, respectively.

Referring to FIGS. 12 and 13, the third dummy gate 443 and the third dummy gate dielectric film 441 are removed, such that a third trench 423 intersecting the first finned active pattern 420 is formed over the first finned active pattern 420. In addition, the fourth dummy gate 543 and the fourth dummy gate dielectric film 541 are removed, such that a fourth trench 523 intersecting the second finned active pattern 520 is formed over the second finned active pattern 520.

Specifically, first spacers 451 and second spacers 551 are formed on the side walls of the third dummy gate 443 and the fourth dummy gate 543, respectively. When the first spacers 451 and the second spacers 551 are formed, a part of the first finned active pattern 420 and the second finned active pattern 520 where the third dummy gate 443 and the fourth dummy gate 543 do not overlap, respectively, is removed, thereby forming recesses.

Subsequently, first source/drain regions 461 and second source/drain regions 561 are formed on either sides of the third dummy gate 443 and the fourth dummy gate 543, respectively.

Subsequently, an interlayer insulation film 120 covering the first source/drain regions 461 and the second source/drain regions 561 is formed. By performing a planarization process, top surfaces of the third dummy gate 443 and the fourth dummy gate 543 are exposed.

Figure 14:
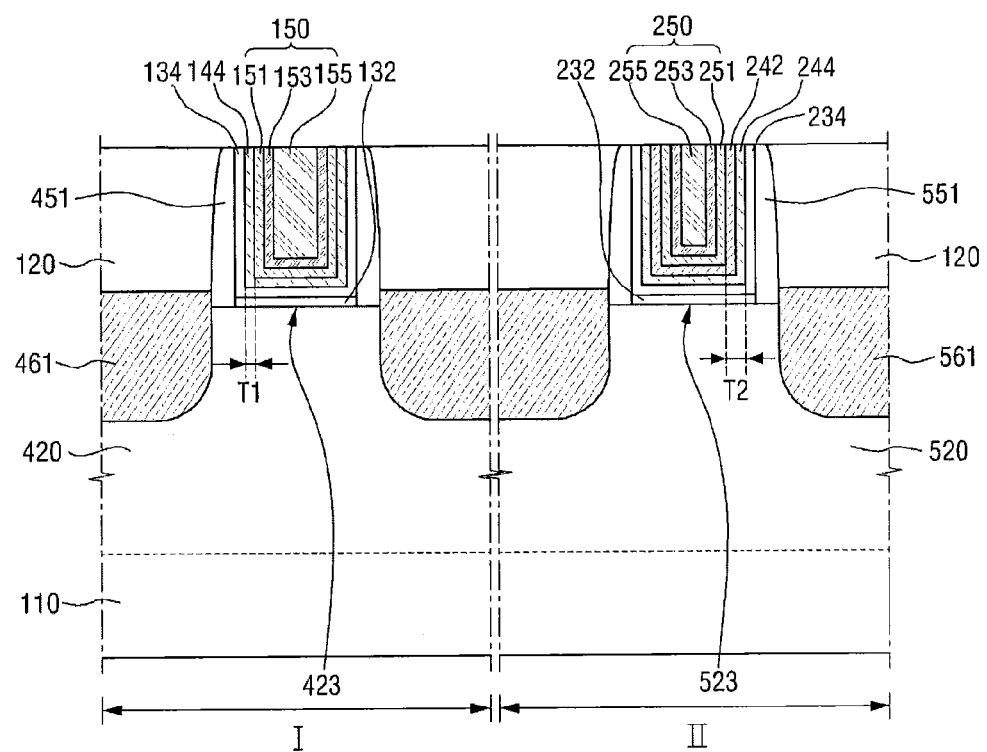

Subsequently, the third dummy gate 443 and the third dummy gate dielectric film 441 are removed, to form a third trench 423 in the first region I, and the fourth dummy gate 543 and the fourth dummy gate dielectric film 541 are removed, to form a fourth trench 523 in the second region II. Referring to FIG. 14, the first interface film 132, the first dielectric film 134, the third conductive film 144 and the first gate metal 150 may be formed in the third trench 423 of the first region I. The first gate metal 150 may include a first work function tuning film 151, a first barrier film 153 and a first metal film 155.

In addition, the second interface film 232, the second dielectric film 234, the second conductive film 242, the fourth conductive film 244 and the second gate metal 250 may be formed in the fourth trench 523 of the second region II. The second gate metal 250 may include a second work function tuning film 251, a second barrier film 253 and a second metal film 255.

Forming the first interface film 132, the first dielectric film 134, the third conductive film 144 and the first gate metal 150 in the third trench 423 and forming the second interface film 232, the second dielectric film 234, the second conductive film 242, the fourth conductive film 244 and the second gate metal 250 in the fourth trench 523 may be substantially identical to the fabricating processes described above with respect to FIGS. 1 to 9.

Figure 15:
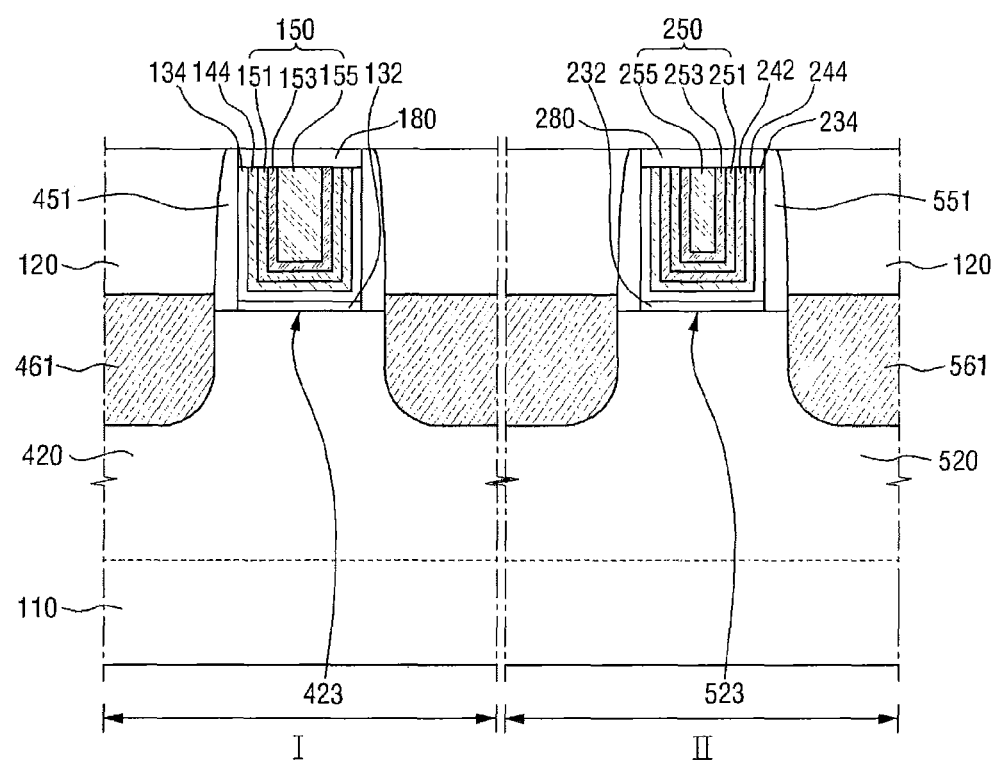

Subsequently, referring to FIG. 15, first and second capping films 180 and 280 covering the third and fourth trenches 423 and 523, respectively, may be formed. The first and second capping films 180 and 280 may include a nitride, e.g., one of Silicon Nitride (SiN), Silicon Oxynitride (SiON), and Silicon-Carbon Oxynitride (SiCON), or an oxide. The first capping film 180 shuts the first dielectric film 134, the third conductive film 144 and the first gate metal 150 off the outside environment, and the second capping film 280 shuts the second dielectric film 234, the second conductive film 242, the fourth conductive film 244 and the second gate metal 250 off the outside environment. Accordingly, a change in the performance of the semiconductor device can be reduced/prevented.

For example, if oxygen atoms permeate into the third trench 423 and the fourth trench 523, the threshold voltages of transistors possibly formed in the first region I and the second region II may be changed.

Although the first and second capping films 180 and 280 are disposed in the third and fourth trenches 423 and 523, respectively, such that they are disposed in the same plane with the interlayer insulation film 120 in some example embodiments, they are not limited thereto.

Referring to FIG. 16, upper insulation films 432 and 532 may be formed on the interlayer insulation film 120. The upper insulation films 432 and 532 may cover the first and second capping films 180 and 280. The upper insulation films 432 and 532 may include the same material as that of the interlayer insulation film 120 and may include silicon oxide, for example. Referring to FIGS. 17 to 19, first and second silicide films 191 and 291 may be formed on the first and second source/drain regions 461 and 561, respectively, and first and second contacts 193 and 293 may be formed such that they penetrate the interlayer insulation film 120 and the upper insulation films 432 and 532 to reach the first and second source/drain regions 461 and 561, respectively. The semiconductor device may include the same type or different types of transistors in the first region I and second region II.

The first and second silicide films 191 and 291 may reduce surface resistance, contact resistance and the like of the first and second source/drain regions 461 and 561, and may include Platinum (Pt), Nickel (Ni), Cobalt (Co), for example. The first and second contacts 193 and 293 may include W, Al, Copper (Cu), etc. It is to be noted that the interlayer insulation film 120 and the upper insulation films 432 and 532 are not shown in FIG. 17, for brevity.

In the semiconductor device according to some example embodiments shown in FIGS. 17 to 19, the thickness T1 of the third conductive film 144 in the first region I may be different from the thickness T2 of the second conductive film 242 and the fourth conductive film 244 in the second region II. Accordingly, the threshold voltage of the transistor formed in the first region I may be different from the threshold voltage of the transistor formed in the second region II.

Hereinafter, a method for fabricating a semiconductor device according to some example embodiments of the present disclosure will be described with reference to FIGS. 20 to 23.

FIGS. 20 to 23 are views for illustrating processes (e.g., operations) of a method for fabricating a semiconductor device according to some example embodiments of the present disclosure.

Figure 20:
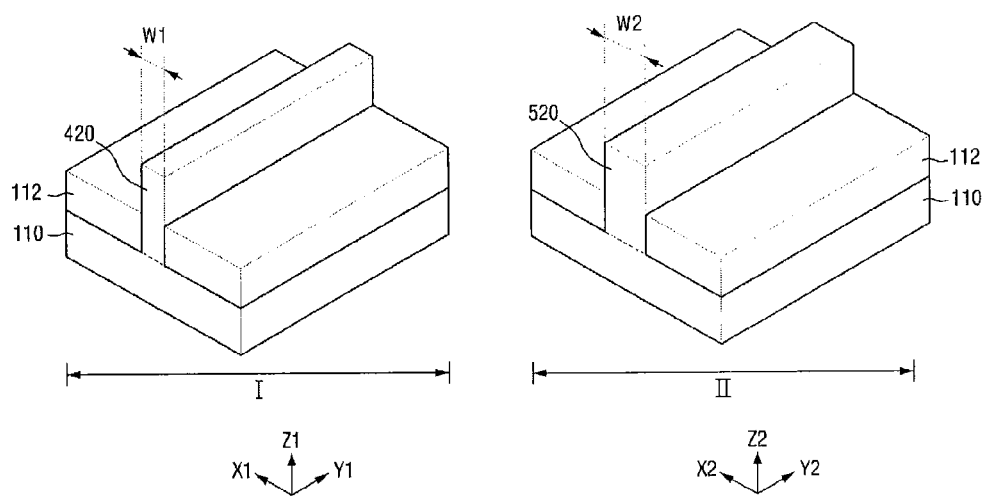
FIGS. 20 to 23 are views for illustrating processes of a method for fabricating a semiconductor device according to some example embodiments of the present disclosure.
Figure 21:
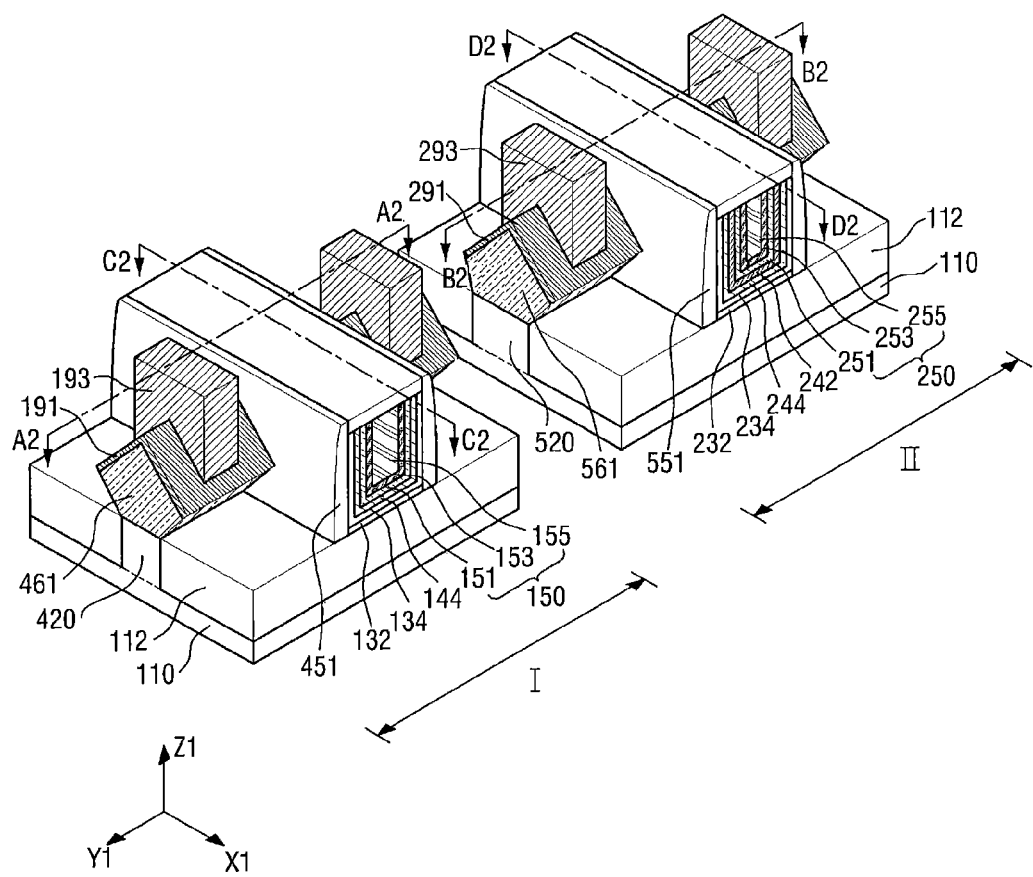
Figure 22:
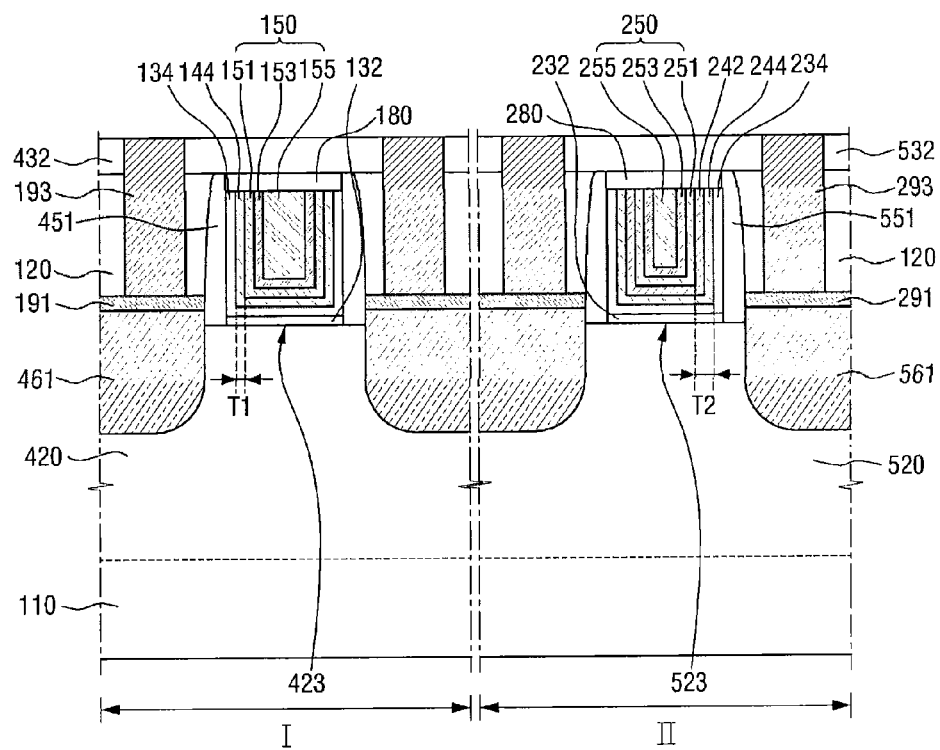
Figure 23:
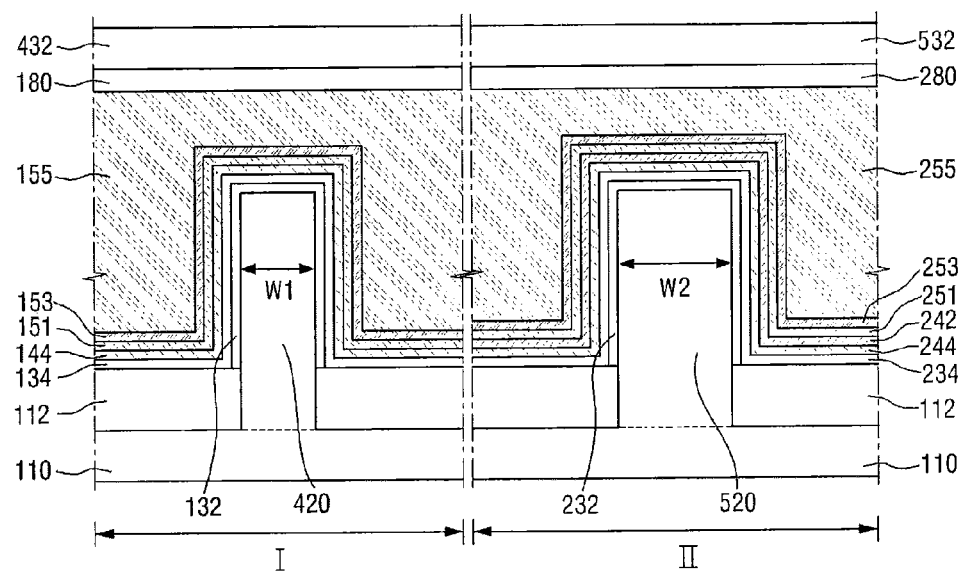

FIG. 20 is a perspective view of a semiconductor device in a process/operation of the method(s) according to some example embodiments of the present disclosure. FIG. 21 is a perspective view of a semiconductor device fabricated by the method(s) according to some example embodiments of the present disclosure. FIG. 22 is a cross-sectional view taken along lines A2-A2 and B2-B2 of FIG. 21. FIG. 23 is a cross-sectional view taken along lines C2-C2 and D2-D2 of FIG. 21. It is to be noted that an interlayer insulation film and an upper insulation film may not be shown in FIG. 21, for brevity.

A method according to some example embodiments may be substantially identical to the method described above with respect to FIGS. 10 to 19, except that the widths of the fins disposed in the first region and second region are different. Like reference numerals denote like elements throughout the drawings, and descriptions of the identical elements may be omitted to avoid redundancy.

Referring to FIG. 20, a first finned active pattern 420 and a second finned active pattern 520 are formed on the substrate 110. The first finned active pattern 420 has a first width W1 and is formed in the first region I, and the second finned active pattern 520 has a second width W2 and is formed in the second region II.

The first width W1 may be different from the second width W2. Although the first width W1 is smaller than the second width W2 in FIG. 20, this is merely illustrative. In some embodiments, the first width W1 may be larger than the second width W2.

The threshold voltage Vth of a transistor including a finned active pattern is affected by the width of the finned active pattern. Specifically, the larger the width of the finned active pattern is, the lower the threshold voltage Vth of the transistor is.

Accordingly, in a method for fabricating a semiconductor device according to some example embodiments, widths of two or more finned active patterns are made different, so that transistors having different threshold voltages can be fabricated.

Specifically, under the same conditions except the difference in width between finned active patterns, a transistor including a first finned active pattern 420 with a first width W1 may have a higher threshold voltage Vth than a transistor including a second finned active pattern 520 with a second width W2. However, it is merely illustrative.

The first finned active pattern 420 with the first width W1 and the second finned active pattern 520 with the second width W2 shown in FIG. 20 are formed, and then the semiconductor device shown in FIGS. 21 to 23 may be fabricated via processes substantially identical to those described above with respect to FIGS. 11 to 16.

Referring to FIGS. 21 to 23, a third conductive film 144 with a first thickness T1 and the first finned active pattern 420 with the first width W1 may be formed in the first region I. Second and fourth conductive films 242 and 244 with a second thickness T2 and the second finned active pattern 520 with the second width W2 may be formed in the second region II.

In some example embodiments, the transistors disposed in the first and second regions I and II may be NMOS transistors. When the transistors in some example embodiments are NMOS transistors, since the first thickness T1 is smaller than the second thickness T2, the threshold voltage of the transistor disposed in the first region I may be smaller than the threshold voltage of the transistor disposed in the second region II.

On the other hand, since the first width W1 is smaller than the second width W2, the threshold voltage of the transistor disposed in the first region I may be higher than the threshold voltage of the transistor disposed in the second region II.

That is, comparing the first region I with the second region II in some example embodiments, the threshold voltage of the transistor disposed in the first region I becomes relatively high due to the first finned active pattern 420 with the first width W1 but is decreased by the third conductive film 144 with the first thickness T1.

Moreover, the threshold voltage of the transistor disposed in the second region II becomes relatively low due to the second finned active pattern 520 with the second width W2 but is increased by the second and fourth conductive films 242 and 244 with the second thickness T2.

Accordingly, according to some example embodiments, the threshold voltages of the transistors disposed in the first and second regions I and II may be controlled so that they are coincident with a target threshold voltage by adjusting the widths and thicknesses of the finned active patterns.

In the above-described embodiment, when the threshold voltages of the transistors become low due to the finned active pattern, they are increased with the conductive film, and when the threshold voltages of the transistors become high due to the finned active pattern, they are decreased with the conductive film. However, the technical ideas/concepts of the present disclosure are not limited thereto.

As will be appreciated by those skilled in the art, the technical ideas/concepts of the present disclosure also encompass further decreasing the threshold voltages of the transistors decreased due to the finned active pattern with the conductive film, and further increasing the threshold voltages of the transistors increased due to the finned active pattern with the conductive film.

Hereinafter, a method for fabricating a semiconductor device according to some example embodiments of the present disclosure will be described with reference to FIGS. 24 to 26.

Figure 24:
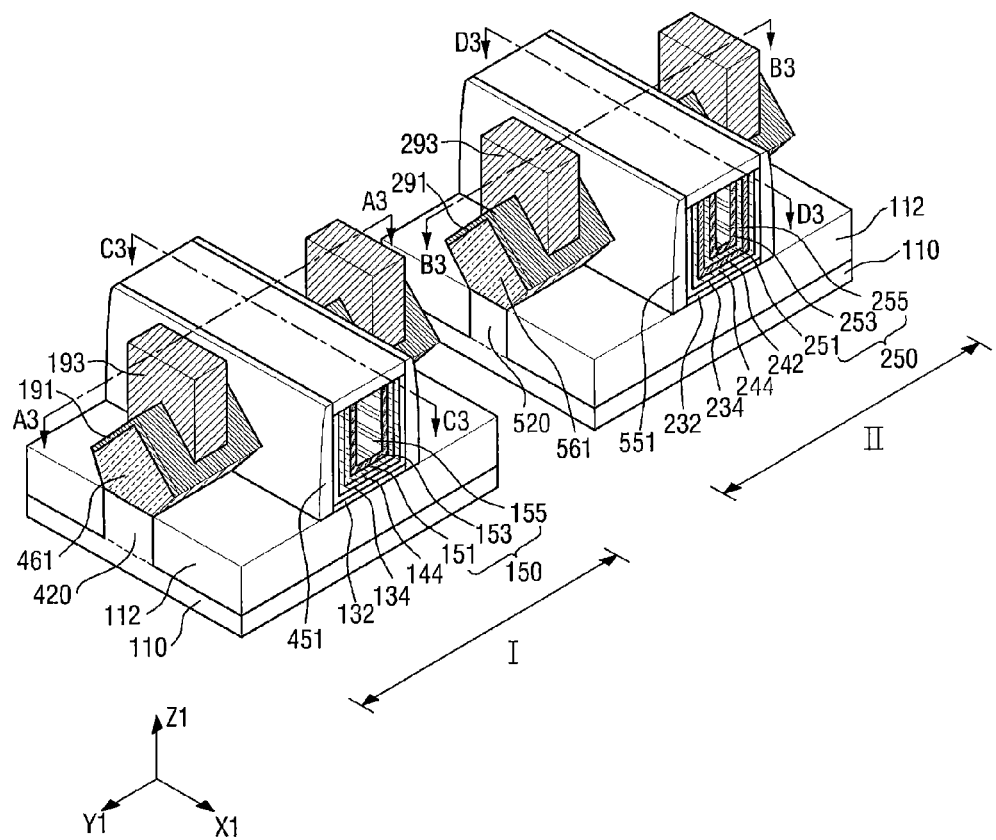
FIGS. 24 to 26 are views for illustrating processes of a method for fabricating a semiconductor device according to some example embodiments of the present disclosure.
Figure 25:
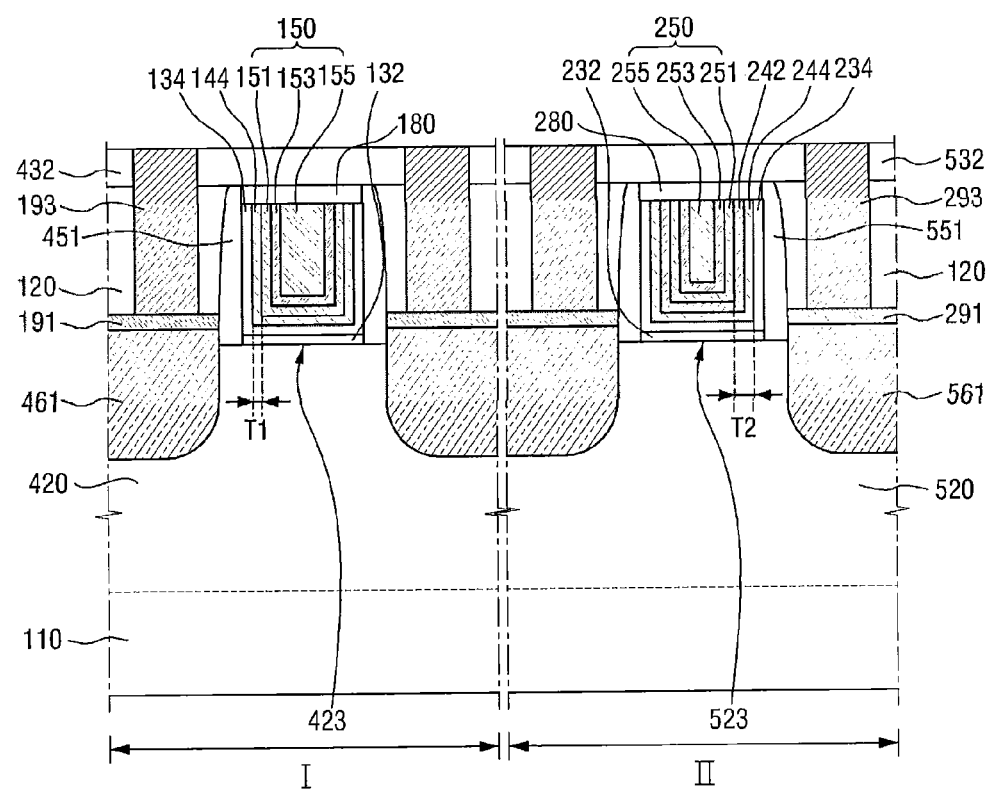
Figure 26:
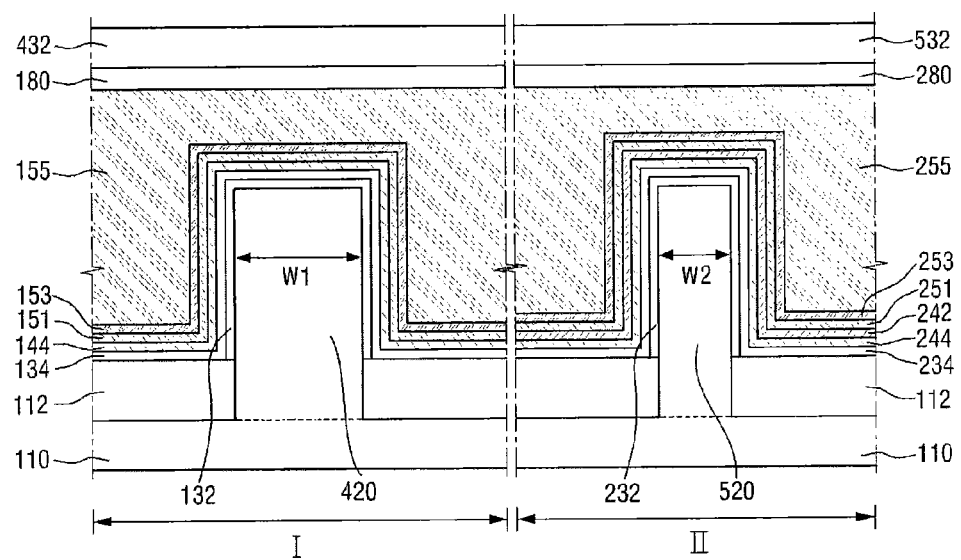

FIGS. 24 to 26 are views for illustrating processes of a method for fabricating a semiconductor device according to some example embodiments of the present disclosure. FIG. 24 is a perspective view of a semiconductor device fabricated by a method according to some example embodiments of the present disclosure. FIG. 25 is a cross-sectional view taken along lines A3-A3 and B3-B3 of FIG. 24. FIG. 26 is a cross-sectional view taken along lines C3-C3 and D3-D3 of FIG. 24. It is to be noted that an interlayer insulation film and an upper insulation film are not shown in FIG. 24, for brevity.

The method in FIGS. 24 to 26 may be substantially identical to the method described above with respect to FIGS. 10 to 19, except that the widths of the fins disposed in the first region and the second region are different. Like reference numerals denote like elements throughout the drawings, and descriptions of the identical elements may be omitted to avoid redundancy.

Referring to FIGS. 24 to 26, a third conductive film 144 with a first thickness T1 and a first finned active pattern 420 with a first width W1 may be formed in the first region I. Second and fourth conductive films 242 and 244 with a second thickness T2 and the second finned active pattern 520 with the second width W2 may be formed in the second region II.

In some example embodiments, the transistors disposed in the first and second regions I and II may be PMOS transistors. When the transistors in some example embodiments are PMOS transistors, since the first thickness Ti is smaller than the second thickness T2, the threshold voltage of the transistor disposed in the first region I may be higher than the threshold voltage of the transistor disposed in the second region II.

On the other hand, since the first width W1 is larger than the second width W2, the threshold voltage of the transistor disposed in the first region I may be lower than the threshold voltage of the transistor disposed in the second region II.

That is, comparing the first region I with the second region II in some example embodiments, the threshold voltage of the transistor disposed in the first region I may become relatively low due to the first finned active pattern 420 with the first width W1 but may be increased by the third conductive film 144 with the first thickness T1.

On the other hand, the threshold voltage of the transistor disposed in the second region II may become relatively high due to the second finned active pattern 520 with the second width W2 but may be decreased by the second and fourth conductive films 242 and 244 with the second thickness T2.

Accordingly, according to some example embodiments, the threshold voltages of the transistors disposed in the first and second regions I and II may be controlled so that they are coincident with a target threshold voltage by adjusting the widths and thicknesses of the finned active patterns.

In some embodiments, when the threshold voltages of the transistors become low due to the finned active pattern, they are increased with the conductive film, and when the threshold voltages of the transistors become high due to the finned active pattern, they are decreased with the conductive film. However, the technical ideas/concepts of the present disclosure are not limited thereto.

As will be appreciated by those skilled in the art, the technical ideas/concepts of the present disclosure also encompass further decreasing the threshold voltages of the transistors decreased due to the finned active pattern with the conductive film, and further increasing the threshold voltages of the transistors increased due to the finned active pattern with the conductive film.

It is to be noted that although the semiconductor devices include the first and second regions in the above-described embodiments, the technical ideas/concepts of the present disclosure are not limited thereto. For example, the semiconductor device according to some embodiments described above with respect to FIG. 21 and the semiconductor device according to some embodiments described above with respect to FIG. 24 may be implemented as a single semiconductor device.

Hereinafter, a method for fabricating a semiconductor device according to some example embodiments of the present disclosure will be described with reference to FIGS. 27 to 39.

FIGS. 27 to 39 are views for illustrating processes/operations of a method for fabricating a semiconductor device according to some example embodiments of the present disclosure.

Figure 27:
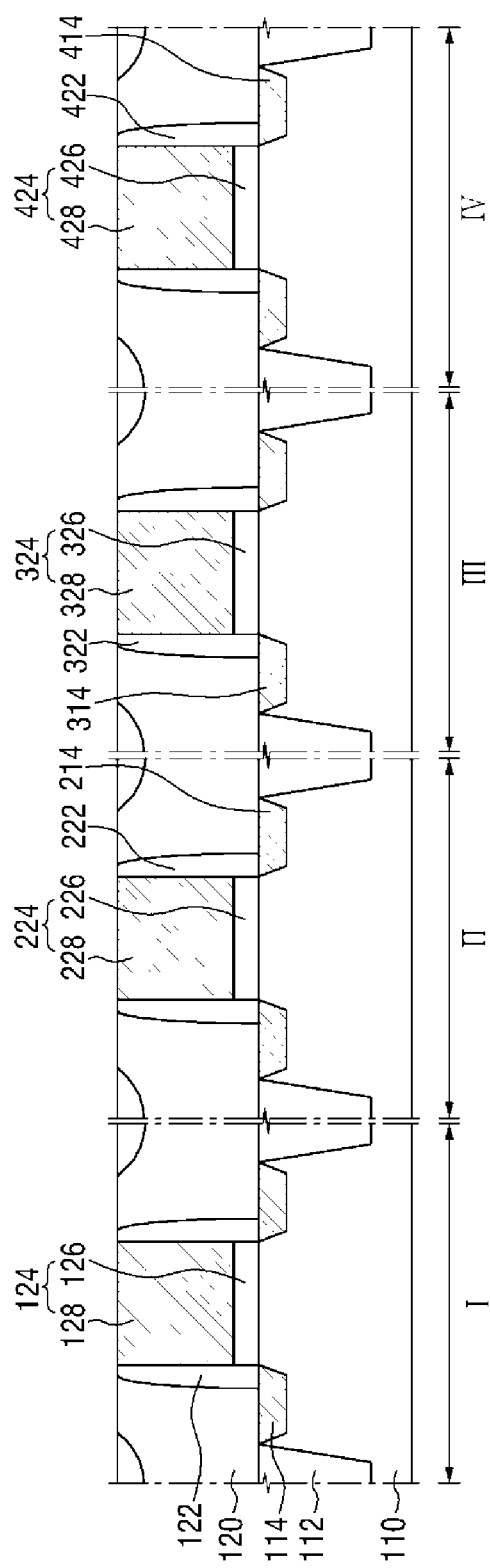
FIGS. 27 to 39 are views for illustrating processes of a method for fabricating a semiconductor device according to some example embodiments of the present disclosure.

Referring to FIG. 27, a substrate 110 may include a first region I, a second region II, a third region III and a fourth region IV. The first region I, the second region II, the third region III and the fourth region IV may be either connected to one another or separated from one another. An active region is defined by forming a device separating film 112 such as a shallow trench isolation (STI).

Subsequently, a first dummy gate feature 124 is formed in the first region I, a second dummy gate feature 224 is formed in the second region II, a third dummy gate feature 324 is formed in the third region III, and a fourth dummy gate feature 424 is formed in the fourth region IV.

The first dummy gate feature 124 may include a first dummy gate insulation film 126 and a first dummy gate electrode 128. The second dummy gate feature 224 may include a second dummy gate insulation film 226 and a second dummy gate electrode 228. The third dummy gate feature 324 may include a third dummy gate insulation film 326 and a third dummy gate electrode 328. The fourth dummy gate feature 424 may include a fourth dummy gate insulation film 426 and a fourth dummy gate electrode 428.

The first to fourth dummy gate insulating films 126, 226, 326 and 426 may be formed on the substrate 110 and may be silicon oxide films. The first to fourth dummy gate electrodes 128, 228, 328 and 428 may be formed on the first to fourth dummy gate insulation films 126, 226, 326 and 426, respectively. The first to fourth dummy gate electrodes 128, 228, 328 and 428 may include, for example, polysilicon.

Subsequently, first to fourth source/drain regions 114, 214, 314 and 414 are formed in the substrate 110 using the first to fourth dummy gate features (e.g., dummy gate structures) 124, 224, 324 and 424 as masks, respectively. The first source/drain regions 114 are formed in the first region I, the second source/drain regions 214 are formed in the second region II, the third source/drain regions 314 are formed in the third region III, and the fourth source/drain regions 414 are formed in the fourth region IV. The first to fourth source/drain regions 114, 214, 314 and 414 may be formed on at least one side of the first to fourth dummy gate features 124, 224, 324 and 424, respectively.

First to fourth spacers 122, 222, 322 and 422 may be formed on side walls of each of the first to fourth dummy gate features 124, 224, 324 and 424, respectively. The first to fourth spacers 122, 222, 322 and 422 may include, for example, silicon oxide or silicon nitride. The first to fourth spacers 122, 222, 322 and 422 may be formed on the side walls of each of the first to fourth dummy gate features 124, 224, 324 and 424, respectively, in such a manner that a spacer film is formed by a CVD process and is then etched back. The shape of the first to fourth spacers 122, 222, 322 and 422 is not limited to that shown in FIG. 27.

Subsequently, an interlayer insulation film 120 is formed on the substrate 110. The interlayer insulation film 120 may cover the spacers 122, 222, 322 and 422 formed on the side walls and expose the top surfaces of the first to fourth dummy gate features 124, 224, 324 and 424. In order to expose the top surfaces of the first and second dummy gate features 124, 224, 324 and 424, a planarization process may be performed after forming the interlayer insulation film 120. The interlayer insulation film 120 may be formed by stacking two or more insulation films, unlike that shown in FIG. 27.

Figure 28:
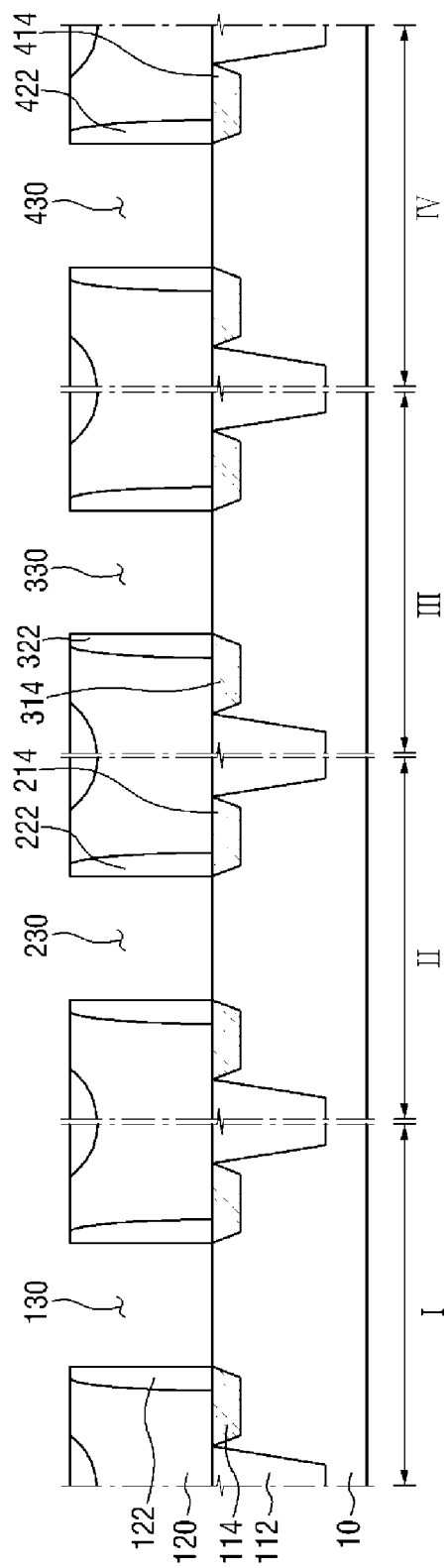

Referring to FIG. 28, the interlayer insulation film 120 is formed that includes a first trench 130 formed in the first region I, a second trench 230 formed in the second region II, a third trench 330 formed in the third region III, and a fourth trench 430 formed in the fourth region IV. The first trench 130 may be formed by removing the first dummy gate feature 124, the second trench 230 may be formed by removing the second dummy gate feature 224, the third trench 330 may be formed by removing the third dummy gate feature 324, and the fourth trench 430 may be formed by removing the fourth dummy gate feature 424.

The side walls of each of the first to fourth spacers 122, 222, 322 and 422 and the top surface of the substrate 110 may be exposed via the first to fourth trenches 130, 230, 330 and 430, respectively.

Figure 29:
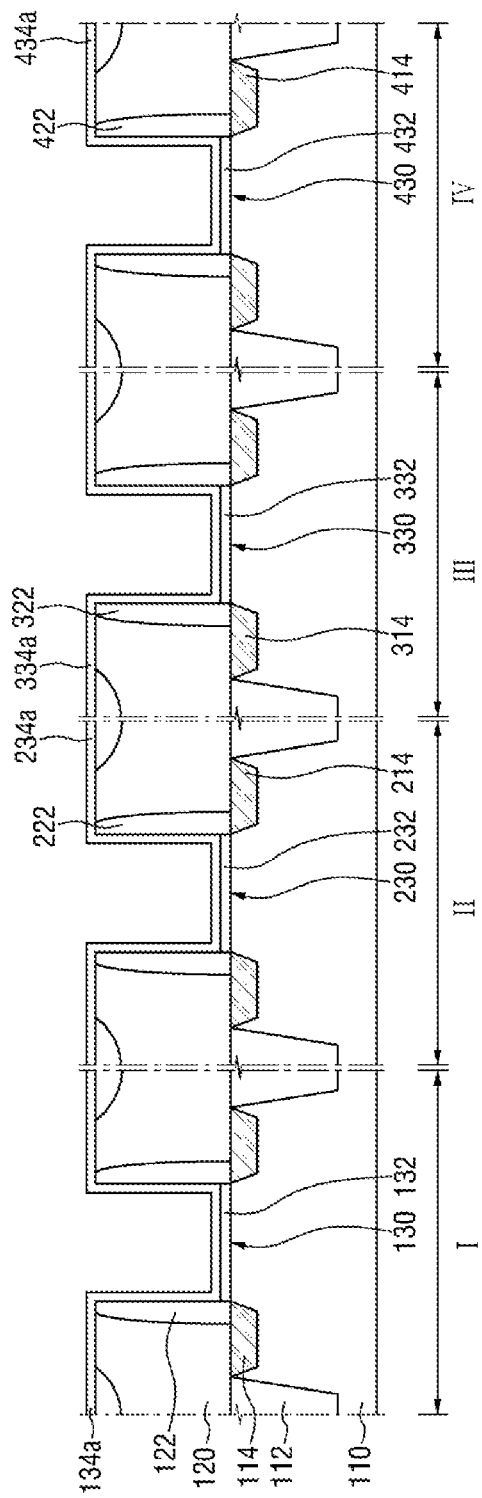

Referring to FIG. 29, a first interface film 132 is formed on the top surface of the substrate 110 in the first trench 130, and a second interface film 232 is formed on the top surface of the substrate 110 in the second trench 230. A third interface film 332 is formed on the top surface of the substrate 110 in the third trench 330, and a fourth interface film 432 is formed on the top surface of the substrate 110 in the fourth trench 430.

The first to fourth interface films 132, 232, 332 and 432 may be formed by, but are not limited to, oxidizing the exposed top surfaces of the substrate 110 in the first to fourth trenches 130, 230, 330 and 430, respectively. The first to fourth interface films 132, 232, 332 and 432 may be formed along the bottom surfaces of the first to fourth trenches 130, 230, 330 and 430, respectively.

Subsequently, a first dielectric film 134a is formed in the first trench 130, a second dielectric film 234a is formed in the second trench 230, a third dielectric film 334a is formed in the third trench 330, and a fourth dielectric film 434a is formed in the fourth trench 430. Specifically, the first dielectric film 134a may be formed such that it conforms to the side walls and the bottom surface of the first trench 130, the second dielectric film 234a may be formed such that it conforms to the side walls and the bottom surface of the second trench 230, the third dielectric film 334a may be formed such that it conforms to the side walls and the bottom surface of the third trench 330, and the fourth dielectric film 434a may be formed such that it conforms to the side walls and the bottom surface of the fourth trench 430.

In addition, the first to fourth dielectric films 134a, 234a, 334a and 434a may be formed on the interlayer insulation film 120 as well. The first to fourth dielectric films 134a, 234a, 334a and 434a may include a high-k material having a dielectric constant higher than that of the silicon oxide film. For example, the first to fourth dielectric films 134a, 234a, 334a and 434a may include a material selected from the group including HfSiON, $HfO_2$, $ZrO_2$, $Ta_2O_5$, $TiO_2$, $SrTiO_3$ and $(Ba,Sr)TiO_3$. The thickness of the first to fourth dielectric films 134a, 234a, 334a and 434a may be determined depending on the type of a device to be formed.

Figure 30:
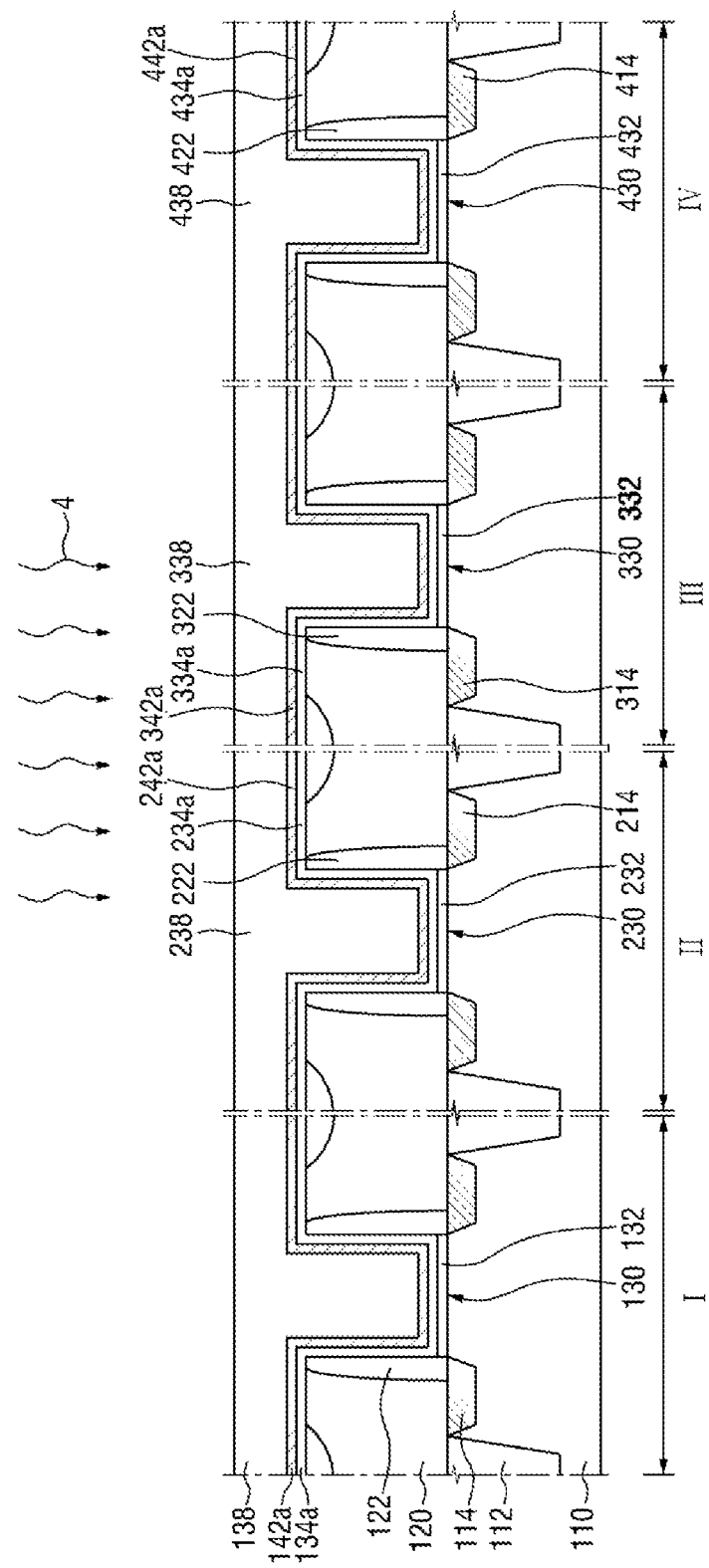

Referring to FIG. 30, first to fourth conductive films 142a, 242a, 342a and 442a are formed, and then first to fourth shield films 138, 238, 338 and 438 are formed. A first conductive film 142a is formed in the first trench 130, a second conductive film 242a is formed in the second trench 230, a third conductive film 342a is formed in the third trench 330, and a fourth conductive film 442a is formed in the fourth trench 430.

The first to fourth conductive films 142a, 242a, 342a and 442a may be formed such that they conform to the side walls and the bottom surfaces of the first to fourth trenches 130, 230, 330 and 430, respectively. The first to fourth conductive films 142a, 242a, 342a and 442a may include a nitride. The first to fourth conductive films 142a, 242a, 342a and 442a may include TiAlN and/or TiN. In some example embodiments, the first to fourth conductive films 142a, 242a, 342a and 442a include TiN, for example. Subsequently, the first to fourth shield films 138, 238, 338 and 438 are formed on the first to fourth conductive films 142a, 242a, 342a and 442a. The first to fourth trenches 130, 230, 330 and 430 may be filled with the first to fourth shield films 138, 238, 338 and 438, respectively, so that the first to fourth conductive films 142a, 242a, 342a and 442a are not exposed. The first to fourth shield films 138, 238, 338 and 438 may include Si, for example.

Subsequently, an annealing process 4 is performed. The first to fourth dielectric films 134a, 234a, 334a and 434a include oxygen atoms. The oxygen atoms are bonded to other substances such as Hf, Zr, Ta, Ti, etc. Some of the bonds between the oxygen atoms and the other substance may be broken. When the bonds are broken, leakage current may occur, so that the performance of a transistor may deteriorate. To reduce/prevent this problem, an annealing process is performed to bond oxygen atoms to a broken bond. By performing the annealing process 4, the oxygen atoms included in the first to fourth conductive films 142a, 242a, 342a and 442a are provided into the first to fourth dielectric films 134a, 234a, 334a and 434a, respectively.

If the first to fourth conductive films 142a, 242a, 342a and 442a are exposed when the annealing process 4 is performed, external oxygen atoms permeate into the first to fourth conductive films 142a, 242a, 342a and 442a, so that the quantity/number of oxygen atoms traveling below the first to fourth conductive films 142a, 242a, 342a and 442a increases. If the oxygen atoms are supplied more than required by the first to fourth dielectric films 134a, 234a, 334a and 434a, excess oxygen atoms may react with the substrate 110 in the first to fourth trenches 130, 230, 330 and 430. As a result, the first to fourth interface films 132, 232, 332 and 432 become thicker, and the performance of a transistor may deteriorate. For this reason, the first to fourth conductive films 142a, 242a, 342a and 442a are isolated from the outside atmosphere at the time of performing the annealing process 4 by forming the first to fourth shield films 138, 238, 338 and 438 on the first to fourth conductive films 142a, 242a, 342a and 442a, respectively, and thus it is possible to appropriately adjust the amount of oxygen atoms supplied.

The annealing process 4 may be performed at a temperature between 500° C. and 1,500° C.

The thickness of the first to fourth conductive films 142a, 242a, 342a and 442a may vary depending on the quantity/number of oxygen atoms to be supplied.

Figure 31:
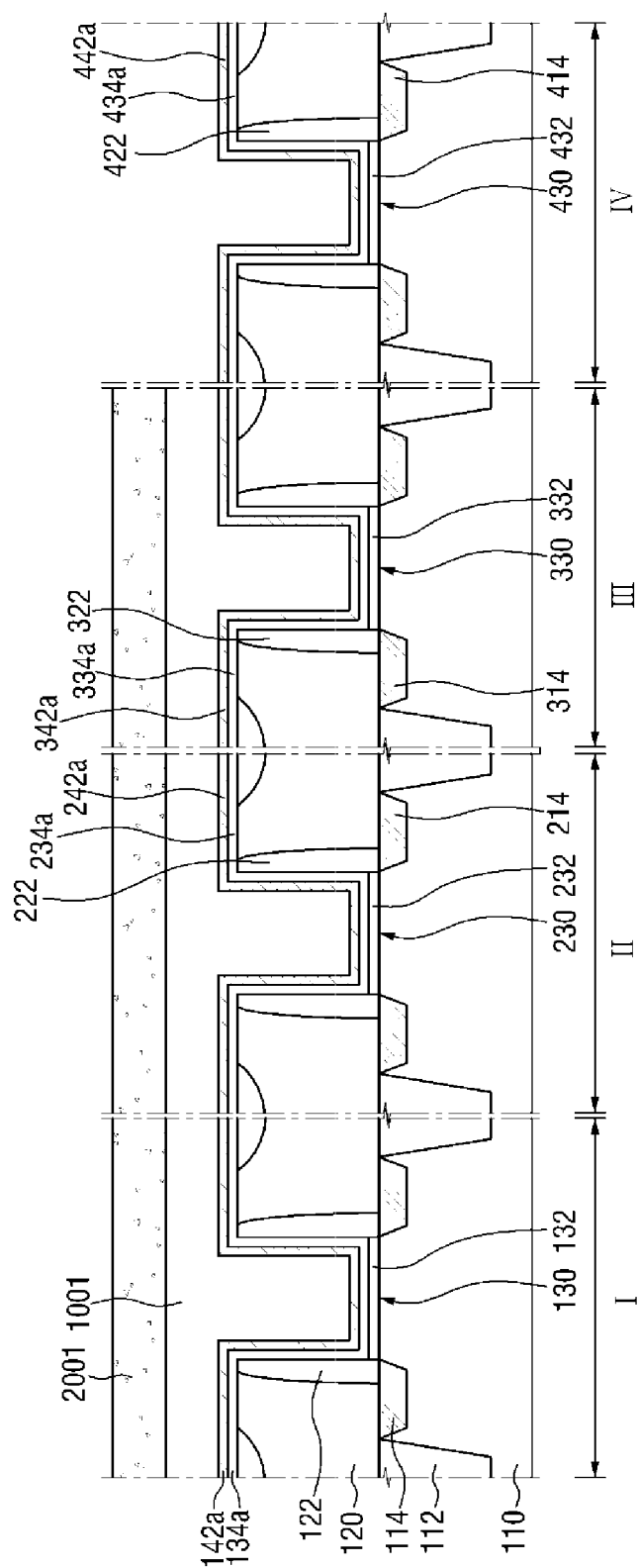

Referring to FIG. 31, the first to fourth shield films 138, 238, 338 and 438 are removed. Subsequently, a first mask pattern 1001 and a first photosensitive film pattern 2001 are formed such that they cover the first to third conductive films 142a, 242a and 342a while exposing the fourth conductive film 442a.

Specifically, a mask film is formed on the first to fourth conductive films 142a, 242a and 342a and 442a so as to fill the first to fourth trenches 130, 230, 330 and 430. The mask film may be formed on the top surface of the interlayer insulation film 120 as well. The mask film may be a bottom anti-reflective coating (BARC) film. In addition, the mask film may include a material exhibiting a good gap-fill property so that the first to fourth trenches 130, 230, 330 and 430 can be filled with the mask film. The mask film may be formed in direct contact with the first to fourth conductive films 142a, 242a, 342a and 442a, respectively.

Subsequently, the first photosensitive film pattern 2001 may be formed on the mask film. The first photosensitive film pattern 2001 exposes the mask film formed on the fourth conductive film 442a while it covers the mask film formed on the first to third conductive films 142a, 242a and 342a. That is, the first photosensitive film pattern 2001 covers the first to third regions I, II and III while exposing the fourth region IV.

Subsequently, the mask film with which the fourth trench 430 is filled is removed using the first photosensitive film pattern 2001 as a mask for an etching process, as shown in FIG. 31. By performing the etching process, the first mask pattern 1001 is formed on the first to third conductive films 142a, 242a and 342a. The first to third trenches 130, 230 and 330 are filled with the first mask pattern 1001. The first mask pattern 1001 is a BARC pattern.

In other words, in the fourth region IV, the mask film formed on the fourth conductive film 442a is removed by the etching process, forming the first mask pattern 1001. The fourth conductive film 442a is exposed by virtue of the first mask pattern 1001. That is, while the fourth conductive film 442a is exposed, the first to third conductive films 142a, 242a and 342a are covered by the first mask pattern 1001 and the first photosensitive film pattern 2001. The first mask pattern 1001 and the first photosensitive film pattern 2001 formed on the first to third conductive films 142a, 242a and 342a form a stack of films, which may be used as an etch mask in a subsequent process.

The mask film with which the fourth trench 430 is filled may be removed by dry etching. The dry etching may be, for example, reactive ion etching (RIE).

Examples of the dry etching for forming the first mask pattern 1001 may include using a mixture gas including oxygen as an etching gas to etch the mask film with which the fourth trench 430 is filled. The mixture gas may include chlorine in addition to oxygen. The mixture gas may further include helium. Another example of the dry etching for forming the first mask pattern 2001 may include using a mixture gas including nitrogen and hydrogen as an etching gas to etch the mask film with which the fourth trench 430 is filled.

Figure 32:
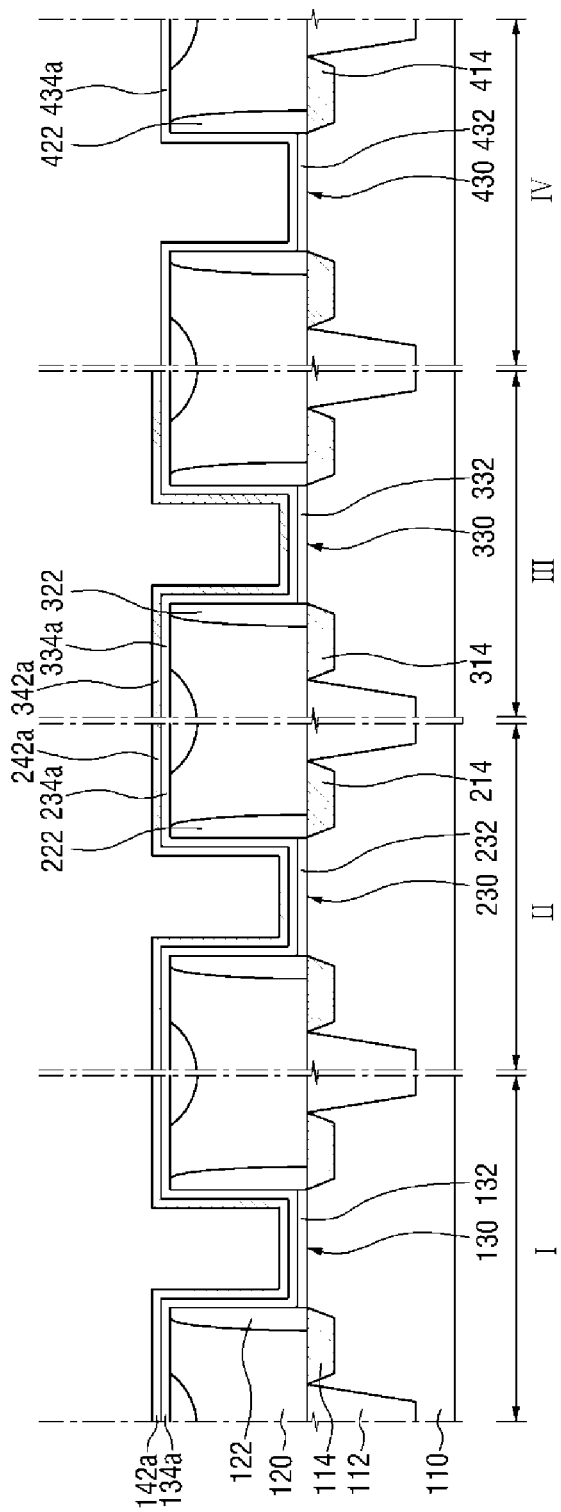

Referring to FIG. 32, the fourth conductive film 442a is removed by using the first mask pattern 1001 as a mask. As a result, the fourth dielectric film 434a may be exposed.

Specifically, the fourth conductive film 442a formed along the side walls and the bottom surface of the fourth trench 430 is removed by using the stack of films of the first mask pattern 1001 and the first photosensitive film pattern 2001 as an etch mask.

The fourth conductive film 442a may be removed by, for example, wet etching. An etchant used in the wet etching may include, but is not limited to, hydrogen peroxide ($H_2O_2$). The wet etching may be performed in order to reduce damage to the fourth dielectric film 434a during the process of removing the fourth conductive film 442a, which is to be exposed.

Subsequently, the first mask pattern 1001 and the first photosensitive film pattern 2001 formed on the first to third conductive films 142a, 242a and 342a may be removed. As the stack of films of the first mask pattern 1001 and the first photosensitive film pattern 2001 is removed, the first to third conductive films 142a, 242a and 342a are exposed.

For example, the first mask pattern 1001 and the first photosensitive film pattern 2001 may be ashed and stripped by using a gas including hydrogen $H_2$ and nitrogen $N_2$, for example.

Subsequently, referring to FIG. 33, fifth to seventh conductive films 144a, 244a and 344a are formed on the first to third conductive films 142a, 242a and 342a, respectively, and an eighth conductive film 444a is formed on the fourth conductive film 434a. The fifth to eighth conductive films 144a, 244a, 344a and 444a may be formed such that they conform to the side walls and the bottom surfaces of the first to fourth trenches 130, 230, 330 and 430, respectively. The fifth to eighth conductive films 144a, 242a, 344a and 444a may include the same nitride as that of the first to fourth conductive films 142a, 242a, 342a and 442a. The fifth to eighth conductive films 144a, 244a, 344a and 444a may include TiAlN and/or TiN. In some example embodiments, the fifth to eighth conductive films 144a, 244a, 344a and 444a include TiN, for example.

Subsequently, a second mask pattern 1003 and a second photosensitive film pattern 2003 are formed in the first, third and fourth regions I, III and IV. The second mask pattern 1003 and the second photosensitive film pattern 2003 cover the fifth, seventh and eighth conductive films 144a, 344a and 444a while exposing the sixth conductive film 244a. The second mask pattern 1003 and the second photosensitive film pattern 2003 are substantially identical to the above-described first mask pattern 1001 and the first photosensitive film pattern 2001, respectively, except for the areas covered and the areas exposed. Therefore, descriptions of the identical elements may be omitted to avoid redundancy.

Figure 34:
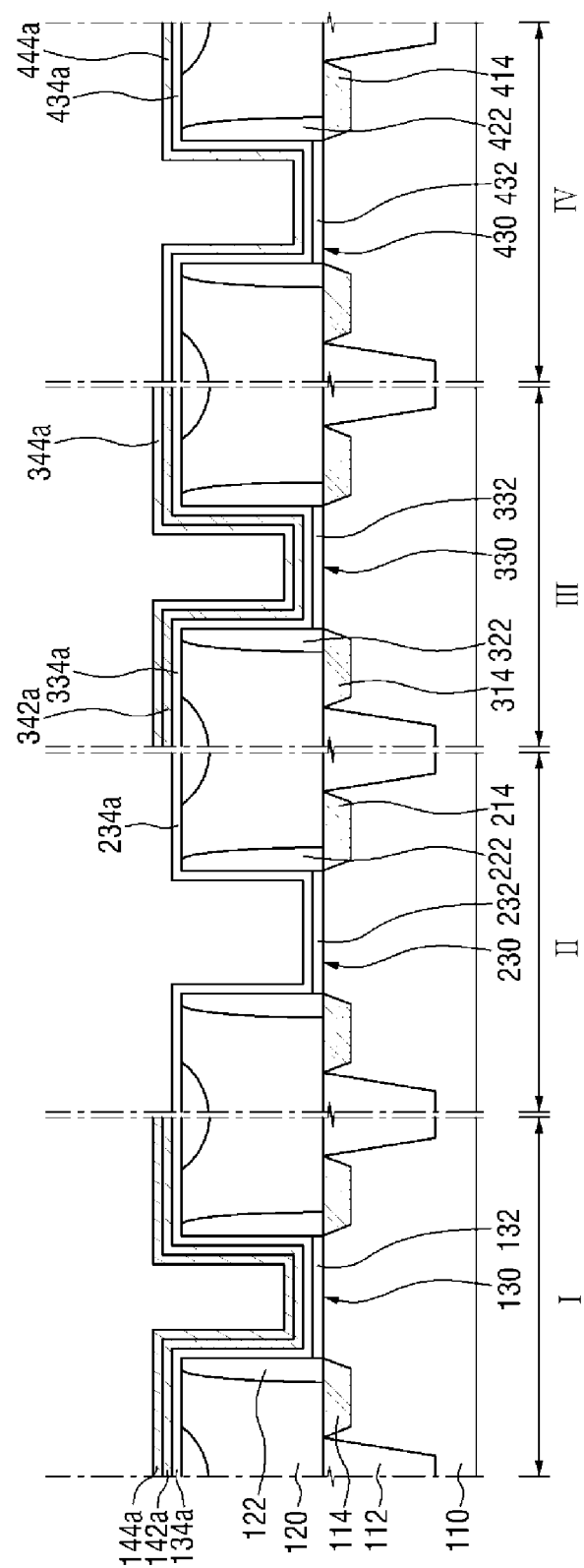

Referring to FIG. 34, the second and sixth conductive films 242a and 244a are removed by using the second mask pattern 1003 as a mask. As a result, the second dielectric film 234a may be exposed. Removing the second and sixth conductive films 242a and 244a using the second mask pattern 1003 as a mask is substantially identical to removing the fourth conductive film 442a using the first mask pattern 1001 as a mask except for the conductive films removed. Therefore, descriptions of the identical elements may be omitted to avoid redundancy.

Figure 33:
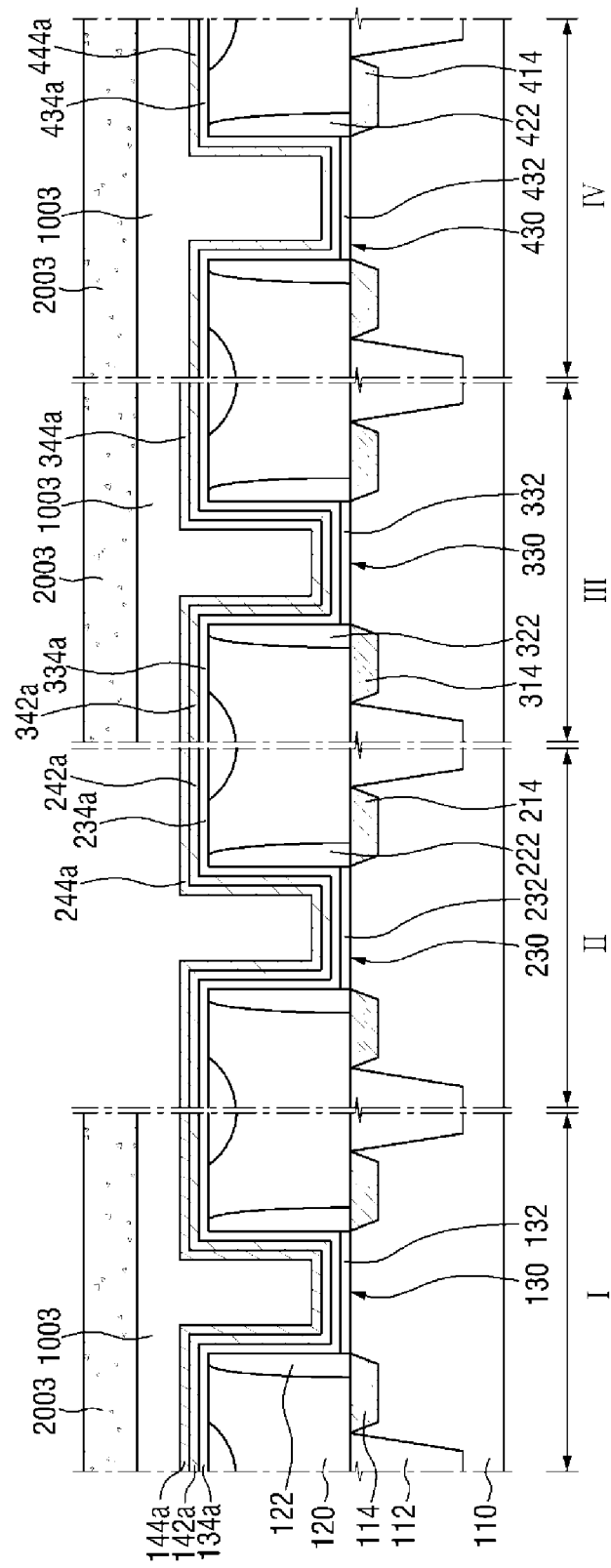

Via the processes shown in FIGS. 33 and 34, the first and fifth conductive films 142a and 144a are formed on the first dielectric film 134a in the first region I, the second dielectric film 234a is exposed in the second region II, the third and seventh conductive films 342a and 344a are formed on the third dielectric film 334a in the third region III, and the eighth conductive film 444a is formed on the fourth dielectric film 434a in the fourth region IV.

Subsequently, referring to FIG. 35, ninth, eleventh and twelfth conductive films 146a, 346a and 446a are formed on the fifth, seventh and eighth conductive films 144a, 344a and 444a, respectively, and a tenth conductive film 246a is formed on the second dielectric film 234a. The ninth to twelfth conductive films 146a, 246a, 346a and 446a may be formed such that they conform to the side walls and the bottom surfaces of the first to fourth trenches 130, 230, 330 and 430, respectively. The ninth to twelfth conductive films 146a, 246a, 346a and 446a may include the same nitride as that of the first to fourth conductive films 142a, 242a, 342a and 442a. The ninth to twelfth conductive films 146a, 246a, 346a and 446a may include TiAlN and/or TiN. In some example embodiments, the ninth to twelfth conductive films 146a, 246a, 346a and 446a include TiN, for example. Subsequently, a third mask pattern 1005 and a third photosensitive film pattern 2005 are formed in the second to fourth regions II, III and IV. The third mask pattern 1005 and the third photosensitive film pattern 2005 cover the tenth to the twelfth conductive films 246a, 346a and 446a while exposing the ninth conductive film 146a. The third mask pattern 1005 and the third photosensitive film pattern 2005 are substantially identical to the above-described first mask pattern 1001 and the first photosensitive film pattern 2001, respectively, except for the areas covered and the areas exposed. Therefore, descriptions of the identical elements may be omitted to avoid redundancy.

Figure 36:
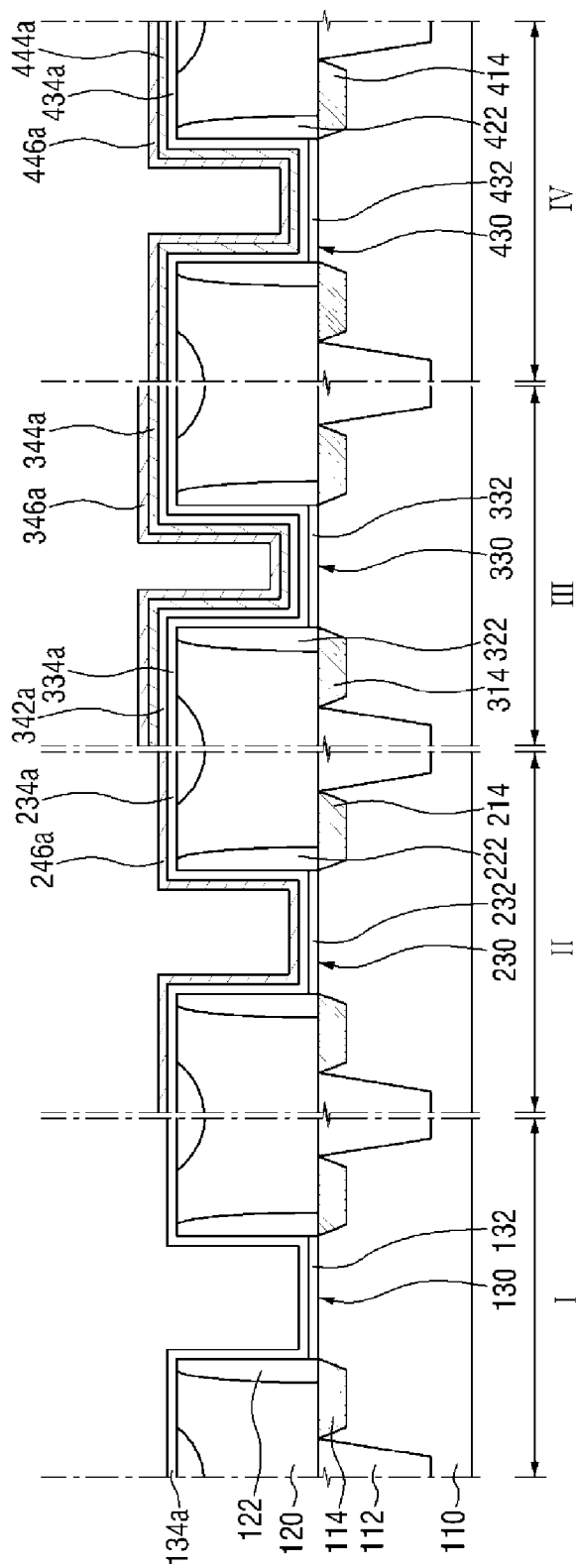

Referring to FIG. 36, the first, fifth and ninth conductive films 142a, 144a and 146a in the first region I are removed by using the third mask pattern 1005 as a mask. As a result, the first dielectric film 134a may be exposed. Removing the first, fifth and ninth conductive films 142a, 144a and 146a using the third mask pattern 1005 as a mask is substantially identical to the removing the fourth conductive film 442a using the first mask pattern 1001 as a mask except for the conductive films they remove. Therefore, descriptions of the identical elements may be omitted to avoid redundancy.

Figure 35:
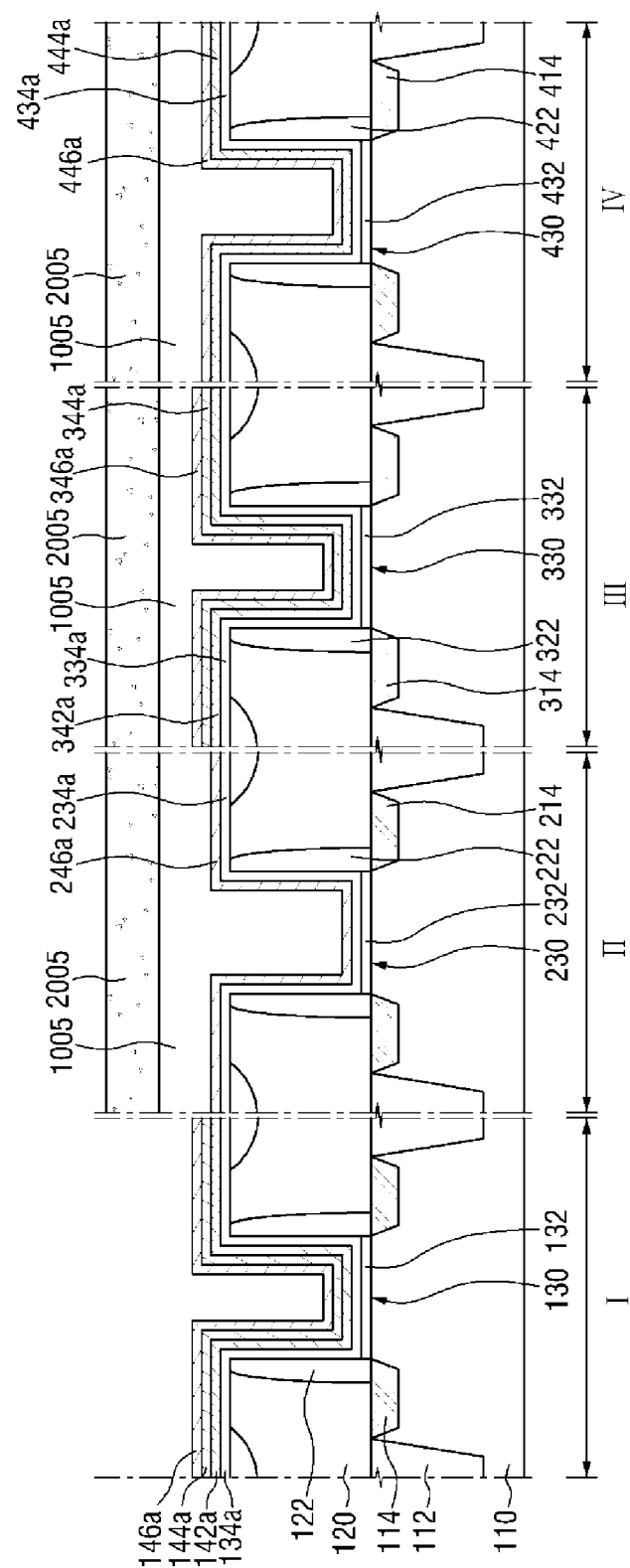

Via the processes shown in FIGS. 35 and 36, the first dielectric film 134a is exposed in the first region I, the tenth conductive film 246a is formed on the second dielectric film 234a in the second region II, the third, seventh and eleventh conductive films 342a, 344a and 346a are formed on the third dielectric film 334a in the third region III, and the eighth and twelfth conductive films 444a and 446a are formed on the fourth dielectric film 434a in the fourth region IV.

Figure 37:
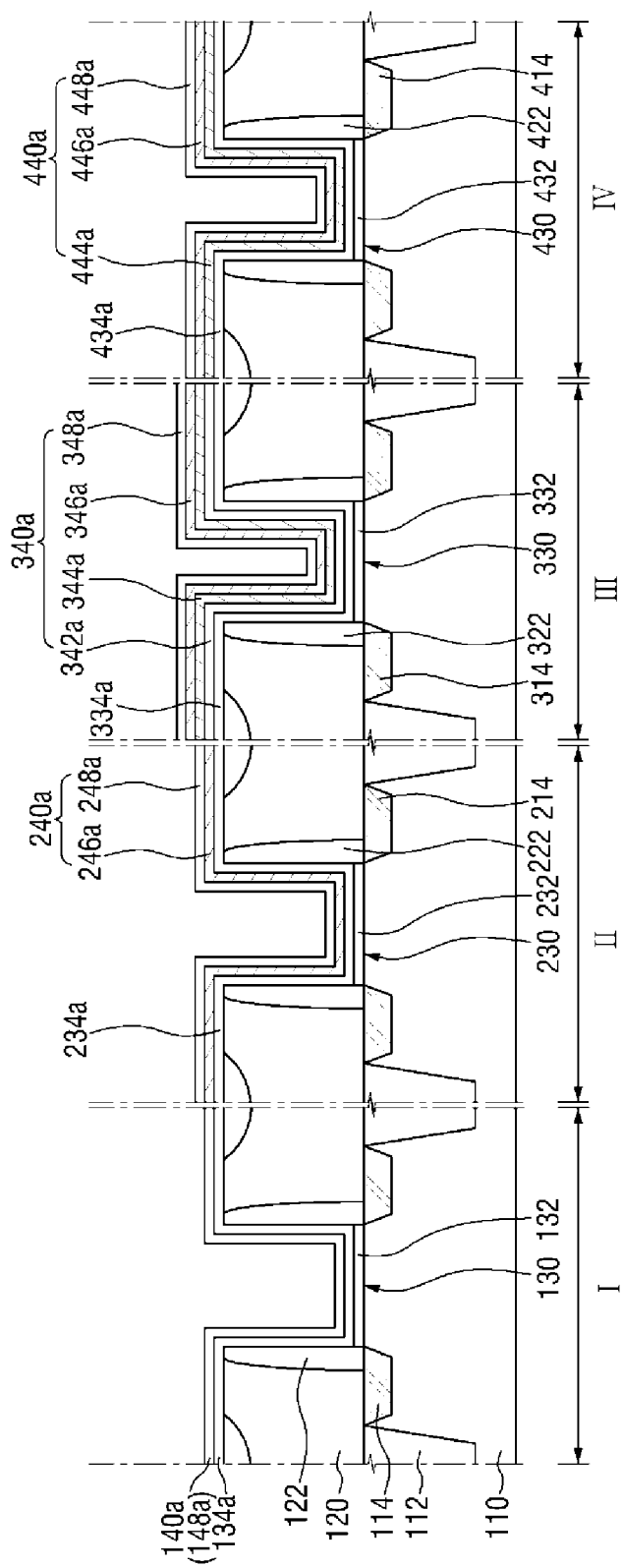

Subsequently, referring to FIG. 37, a thirteenth conductive film 148a is formed on the first dielectric film 134a, and fourteenth to sixteenth conductive films 248a, 348a and 448a are formed on the tenth to twelfth conductive films 246a, 346a and 446a, respectively.

The thirteenth to sixteenth conductive films 148a, 248a, 348a and 448a may be formed such that they conform to the side walls and the bottom surfaces of the first to fourth trenches 130, 230, 330 and 430, respectively. The thirteenth to sixteenth conductive films 148a, 248a, 348a and 448a may include the same nitride as that of the first to fourth conductive films 142a, 242a, 342a and 442a. The thirteenth to sixteenth conductive films 148a, 248a, 348a and 448a may include TiAlN and/or TiN. In some example embodiments, the thirteenth to sixteenth conductive films 148a, 248a, 348a and 448a include TiN, for example.

Figure 38:
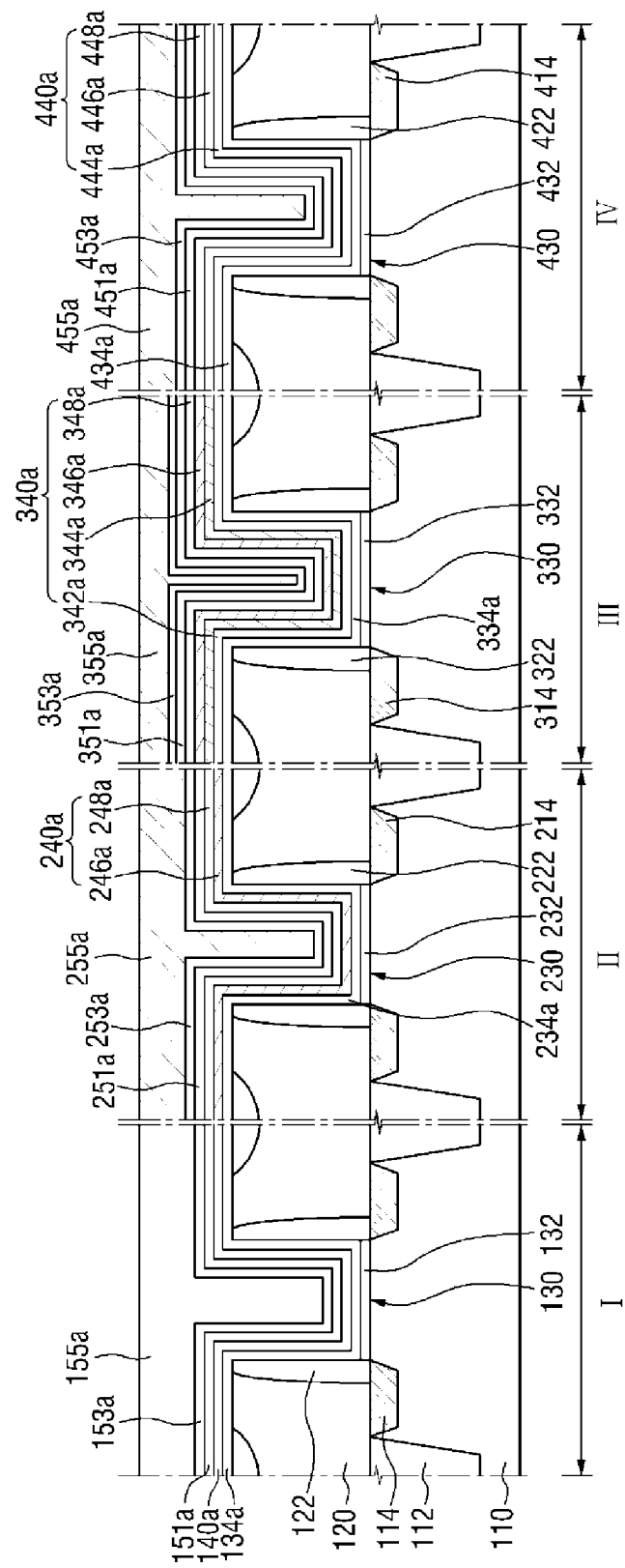

Referring to FIG. 38, first to fourth work function tuning films 151a, 251a, 351a and 451a are formed in the first to fourth regions I to IV, respectively. The first to fourth work function tuning films 151a, 251a, 351a and 451a may be formed such that they conform to the side walls and the bottom surfaces of the first to fourth trenches 130, 230, 330 and 430, respectively. The first to fourth work function tuning films 151a, 251a, 351a and 451a may include at least one of TiAl, TiAlN and TiAlC. In some example embodiments, the first to fourth work function tuning films 151a, 251a, 351a and 451a include TiAlC.

Subsequently, first to fourth barrier films 153a, 253a, 353a and 453a are formed on the first to fourth work function tuning films 151a, 251a, 351a and 451a, respectively. Specifically, the first to fourth barrier films 153a, 253a, 353a and 453a may be formed such that they conform to the side walls and the bottom surfaces of the first to fourth trenches 130, 230, 330 and 430, respectively. The first to fourth barrier films 153a, 253a, 353a and 453a may include TiN, for example. The first to fourth barrier films 153a, 253a, 353a and 453a may impede/prevent a material included in the first to fourth metal layers 155a, 255a, 355a and 455a from being diffused into the first to fourth trenches 130, 230, 330 and 430.

The first to fourth metal layers 155a, 255a, 355a and 455a may be formed on the first to fourth barrier films 153a, 253a, 353a and 453a, respectively. The remaining portions of the first to fourth trenches 130, 230, 330 and 430 may be filled with the first to fourth metal layers 155a, 255a, 355a and 455a, respectively. The first to fourth metal layers 155a, 255a, 355a and 455a may include, for example, A1 or W.

Figure 39:
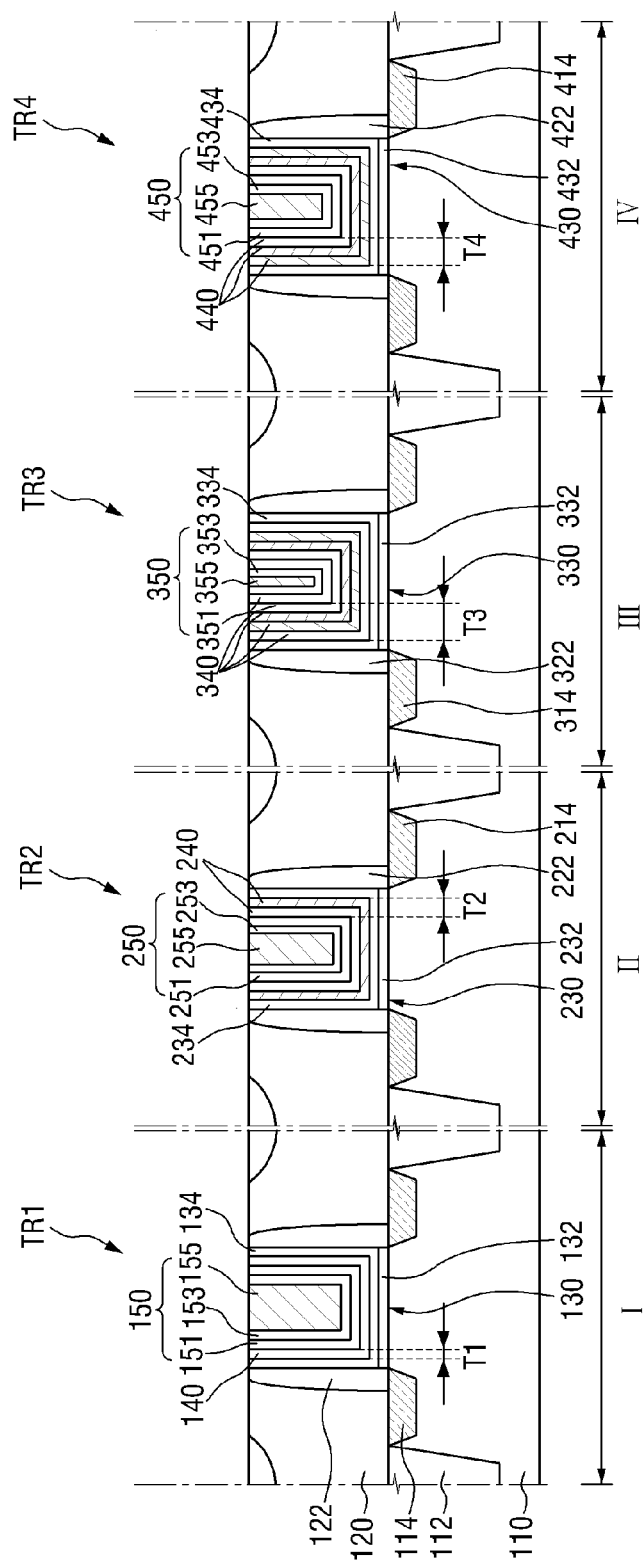

Subsequently, referring to FIG. 39, by performing a planarizing process so that the interlayer insulation film 120 is exposed, a first transistor TR1 may be formed in the first region I of the substrate 110, which includes the first source/drain regions 114, the first spacer 122, the first interface film 132, the first dielectric film 134, a first stack of conductive films 140 with the first thickness T1, and the first gate metal 150. The first gate metal 150 may include the first work function tuning film 151, the first barrier film 153 and the first metal layer 155. The first stack of conductive films 140 may include the thirteenth conductive film 148a.

In addition, a second transistor TR2 may be formed in the second region II of the substrate 110, which includes the second source/drain regions 214, the second spacer 222, the second interface film 232, the second dielectric film 234, a second stack of conductive films 240 with the second thickness T2, and the second gate metal 250. The second gate metal 250 may include the second work function tuning film 251, the second barrier film 253 and the second metal film 255. The second stack of conductive films 240 may include the tenth conductive film 246a and the fourteenth conductive film 248a.

In addition, a third transistor TR3 may be formed in the third region III of the substrate 110, which includes the third source/drain regions 314, the third spacer 322, the third interface film 332, the third dielectric film 334, a third stack of conductive films 340 with the third thickness T3, and the third gate metal 350. The third gate metal 350 may include the third work function tuning film 351, the third barrier film 353 and the third metal layer 355. The third stack of conductive films 340 may include the third conductive film 342a, the seventh conductive film 344a, the eleventh conductive film 346a and the fifteenth conductive film 348a. In some example embodiments, the third conductive film 342a is one that exists when the annealing process is performed in the process described above with respect to FIGS. 4 and 30.

In addition, a fourth transistor TR4 may be formed in the fourth region IV of the substrate 110, which includes the fourth source/drain regions 414, the fourth spacer 422, the fourth interface film 432, the fourth dielectric film 434, a fourth stack of conductive films 440 with the fourth thickness T4, and the fourth gate metal 450. The fourth gate metal 450 may include the fourth work function tuning film 451, the fourth barrier film 453 and the fourth metal layer 455. The fourth stack of conductive films 440 may include the eighth conductive film 444a, the twelfth conductive film 446a and the sixteen conductive film 448a.

The first to fourth gate metals 150, 250, 350 and 450 may include neither lanthanum (La) nor tantalum nitride (TaN). And, neither lanthanum (La) nor tantalum nitride (TaN) is disposed on the first to fourth dielectric films 134, 234, 334 and 434.

The thicknesses T1 to T4 of the first to fourth stacks of conductive films 140, 240, 340 and 440 may be different from one another. Specifically, the second thickness T2 may be larger than the first thickness T1, the third thickness T3 may be larger than the second thickness T2, and the fourth thickness T4 may be larger than the second thickness T2 and less than the third thickness T3.

As described above, the threshold voltages of the first to fourth transistors TR1 to TR4 according to some example embodiments can be controlled by adjusting the thicknesses of the first to fourth stacks of conductive films 140, 240, 340 and 440. Accordingly, the thicknesses of the first to fourth stacks of conductive films 140, 240, 340 and 440 may be determined/selected as desired/required.

According to some example embodiments, the first and second transistors TR1 and TR2 may be NMOS transistors, and the third and fourth transistors TR3 and TR4 may be PMOS transistors. In this instance, the transistors TR1 and TR2 formed in the first and second regions I and II of the substrate 110 may include the first and second stacks of conductive films 140 and 240 having thicknesses less than those of the transistors TR3 and TR4 formed in the third and fourth regions III and IV of the substrate 110.

That is, the third and fourth stacks of conductive films 340 and 440 may have thicknesses larger than those of the first and second stacks of conductive films 140 and 240. Accordingly, the thicknesses of the conductive films included in the PMOS transistors TR3 and TR4 are larger than those of the conductive films of the NMOS transistors TR1 and TR2.

In addition, the first and third regions I and III of the substrate 110 may have a relatively low voltage, and the second and fourth regions II and IV of the substrate 110 may have a relatively high voltage. Accordingly, the first transistor TR1 formed in the first region I may be a low-voltage NMOS transistor, the second transistor TR2 formed in the second region II may be a high-voltage NMOS transistor, the third transistor TR3 formed in the third region III may be a low-voltage PMOS transistor, and the fourth transistor TR4 formed in the fourth region IV may be a high-voltage PMOS transistor.

That is, the threshold voltage Vt1 of the first transistor TR1 formed in the first region I may be lower than the threshold voltage Vt2 of the second transistor TR2 formed in the second region II. The threshold voltage Vt3 of the third transistor TR3 formed in the third region III may be lower than the threshold voltage Vt4 of the fourth transistor TR4 formed in the fourth region IV.

Although the first and second regions I and II are NFET regions and the third and fourth regions III and IV are PFET regions in some example embodiments, this is merely illustrative. For example, all of the first to fourth regions I, II, III and IV may be either NFET regions or PFET regions. In addition, three or more regions may be either NFET regions or PFET regions. The threshold voltages of the transistors formed in the regions may be adjusted with the conductive films. Although two NFET regions and two PFET regions are shown in FIG. 39, this is merely illustrative. It will be understood by those skilled in the art that the technical ideas/concepts of the present disclosure are not limited thereto.

Figure 40:
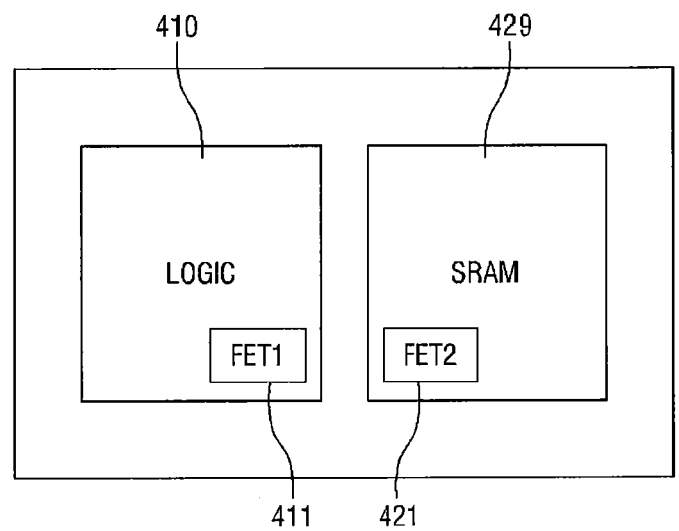
FIG. 40 is a diagram for illustrating a semiconductor device fabricated by the method according to some example embodiments of the present disclosure.
Figure 41:
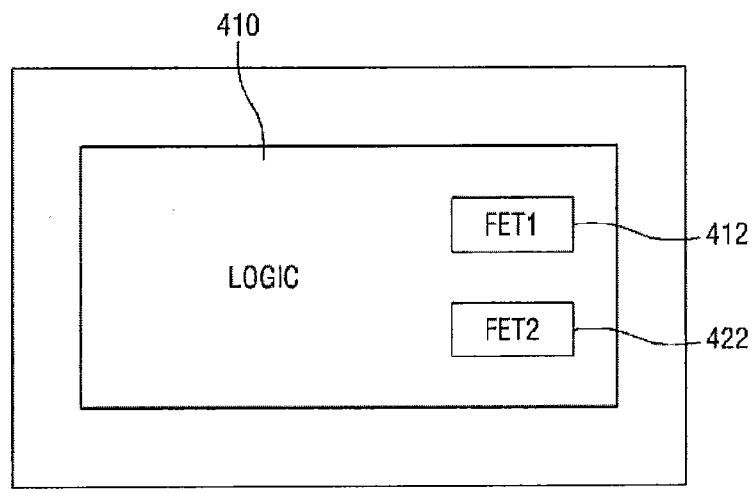
FIG. 41 is a diagram for illustrating a semiconductor device fabricated by the method according to some example embodiments of the present disclosure.

FIG. 40 is a diagram for illustrating a semiconductor device fabricated by a method according to some example embodiments of the present disclosure. FIG. 41 is a diagram for illustrating a semiconductor device fabricated by a method according to some example embodiments of the present disclosure.

In the following descriptions, descriptions will be made focusing on differences from the above example embodiments, and redundant descriptions may be omitted.

Referring to FIG. 40, a semiconductor device 13 may include a logic region 410 and a SRAM region 429. An eleventh transistor 411 may be disposed in the logic region 410. A twelfth transistor 421 may be disposed in the SRAM region 429.

In some embodiments, the threshold voltage of the eleventh transistor 411 may be higher than the threshold voltage of the twelfth transistor 421. Accordingly, if the first transistor TR1 shown in FIG. 39 is employed as the eleventh transistor 411, one of the second to fourth transistors TR2 to TR4 shown in FIG. 39 may be employed as the twelfth transistors 421.

Referring to FIG. 41, a semiconductor device 14 may include a logic region 410 where thirteenth and fourteenth transistors 412 and 422 are disposed. The thirteenth transistor 412 may be different from the fourteenth transistor 422. In some embodiments, the thirteenth and fourteenth transistors 412 and 422 may be disposed in a SRAM region, and the thirteenth transistor 412 may be different from the fourteenth transistor 422.

In some embodiments, the threshold voltage of the thirteenth transistor 412 may be higher than the threshold voltage of the fourteenth transistor 422. Accordingly, if the first transistor TR1 shown in FIG. 39 is employed as the thirteenth transistor 412, one of the second to fourth transistors TR2 to TR4 shown in FIG. 39 may be employed as the fourteenth transistors 422.

Although the logic region 410 and the SRAM region 429 are shown in FIG. 41, this is merely illustrative. For example, the present disclosure may be applied to the semiconductor device including the logic region 410 and other types of memories, e.g., a DRAM, a MRAM, a RRAM, a PRAM, etc.

Figure 42:
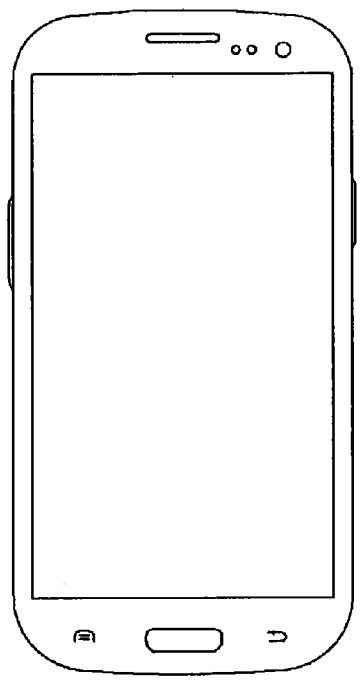
FIG. 42 is a view showing an example of a semiconductor system that can employ the semiconductor devices fabricated by methods according to some example embodiments of the present disclosure.

FIG. 42 is a view showing an example of a semiconductor system that can employ the semiconductor devices fabricated by a method according to some example embodiments of the present disclosure.

FIG. 42 shows a smartphone 1400. As will be appreciated by those skilled in the art, the semiconductor devices fabricated using methods for fabricating a semiconductor device according to the example embodiments of the present disclosure may be employed by other integrated circuit devices than those mentioned above. For example, although a tablet PC, a laptop computer, and the smartphone 1400 are examples of the semiconductor system according to some example embodiments, the examples of the semiconductor system are not limited thereto. In some example embodiments of present inventive concepts, the semiconductor system may be implemented as: a computer, UMPC (Ultra Mobile PC), a workstation, a net-book, a PDA (Personal Digital Assistant), a portable computer, a wireless phone, a mobile phone, an e-book, a PMP (portable multimedia player), a portable game console, a navigation device, a digital camera, a 3-dimensional television, a digital audio recorder, a digital audio player, a digital picture recorder, a digital picture player, a digital video recorder, a digital video player, etc.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method for fabricating a semiconductor device, the method comprising:
   forming an interlayer insulation film on a substrate, the interlayer insulation film comprising a first trench therein and a second trench therein that are spaced apart from each other;
   conformally forming a first dielectric film in the first trench and a second dielectric film in the second trench;
   forming a first conductive film on the first dielectric film and a second conductive film on the second dielectric film;
   forming a first shield film on the first conductive film and a second shield film on the second conductive film;
   performing annealing after the forming of the first and second shield films;
   removing the first and second shield films and the first conductive film after performing the annealing;
   forming a third conductive film on the first dielectric film and a fourth conductive film on the second conductive film; and
   forming a first gate metal on the third conductive film and a second gate metal on the fourth conductive film.

2. The method of claim 1, wherein the first to fourth conductive films comprise Titanium Nitride (TiN) films.

3. The method of claim 2, wherein:
   forming the first gate metal comprises sequentially stacking a first work function tuning film, a first barrier film, and a first metal film; and
   forming the second gate metal comprises sequentially stacking a second work function tuning film, a second barrier film, and a second metal film.

4. The method of claim 3, wherein:
   the first work function tuning film contacts the third conductive film; and
   the second work function tuning film contacts the fourth conductive film.

5. The method of claim 4, wherein the first and second gate metals are free of lanthanum (La) and free of tantalum nitride (TaN).

6. The method of claim 1, further comprising:
   forming a first interface film on the substrate in the first trench and a second interface film on the substrate in the second trench, before the forming of the first and second dielectric films.

7. The method of claim 1, wherein the removing of the first and second shield films and the first conductive film comprises removing at least a portion of the first conductive film after removing the first and second shield films.

8. The method of claim 1, further comprising:
   forming first and second fins on the substrate, the first and second fins extending in a first direction and having different widths,
   wherein the forming of the interlayer insulation film comprises forming the first trench on the first fin and the second trench on the second fin.

9. The method of claim 1, wherein the forming of the first and second shield films comprises forming the first and second shield films to fill the first and second trenches, respectively.

10. A method for fabricating a semiconductor device, the method comprising:
   forming first to fourth dielectric films in first to fourth regions of a substrate, respectively;
   forming first to fourth conductive films on the first to fourth dielectric films, respectively;
   forming first to fourth shield films on the first to fourth conductive films, respectively;
   performing annealing after the forming of the first to fourth shield films;

removing the first to fourth shield films and the fourth conductive film to expose the fourth dielectric film, after performing the annealing;

forming fifth to eighth conductive films on the first to third conductive films and the fourth dielectric film, respectively;

removing the second and sixth conductive films to expose the second dielectric film;

forming ninth to twelfth conductive films on the fifth conductive film, the second dielectric film, the seventh conductive film, and the eighth conductive film, respectively;

removing the first, fifth, and ninth conductive films to expose the first dielectric film;

forming thirteenth to sixteenth conductive films on the first dielectric film and the tenth to twelfth conductive films, respectively; and forming first to fourth gate metals on the thirteenth to sixteenth conductive films, respectively.

11. The method of claim 10, wherein:

forming the first gate metal comprises sequentially stacking a first work function tuning film, a first barrier film, and a first metal film;

forming the second gate metal comprises sequentially stacking a second work function tuning film, a second barrier film, and a second metal film;

forming the third gate metal comprises sequentially stacking a third work function tuning film, a third barrier film, and a third metal film; and forming the fourth gate metal comprises sequentially stacking a fourth work function tuning film, a fourth barrier film, and a fourth metal film.

12. The method of claim 11, wherein:

the first work function tuning film contacts the thirteenth conductive film;

the second work function tuning film contacts the fourteenth conductive film;

the third work function tuning film contacts the fifteenth conductive film; and the fourth work function tuning film contacts the sixteenth conductive film.

13. The method of claim 12, wherein the first to fourth dielectric films are free of lanthanum (La) thereon and are free of tantalum nitride (TaN) thereon.

14. The method of claim 10, wherein first to fourth transistors comprising different threshold voltages are in the first to fourth regions, respectively, wherein the first and second transistors comprise NMOS transistors, and wherein the third and fourth transistors comprise PMOS transistors.

15. The method of claim 14, wherein the threshold voltage of the first transistor is lower than the threshold voltage of the second transistor, and wherein the threshold voltage of the third transistor is lower than the threshold voltage of the fourth transistor.

16. A method of forming a semiconductor device, the method comprising:

conformally forming first and second dielectric layers in first and second trenches, respectively, of an interlayer insulator;

conformally forming first and second conductive layers on the first and second dielectric layers, respectively;

forming first and second protective layers on the first and second conductive layers, respectively;

performing an annealing process while the first and second protective layers are on the first and second conductive layers;

removing the first and second protective layers;

removing the first conductive layer, after performing the annealing process; and forming first and second gate metals in the first and second trenches, respectively, after removing the first conductive layer.

17. The method of claim 16, further comprising conformally forming third and fourth conductive layers on the first dielectric layer and the second conductive layer, respectively, after removing the first conductive layer.

18. The method of claim 17, wherein:

removing the first and second protective layers comprises exposing the first and second conductive layers;

removing the first conductive layer comprises exposing the first dielectric layer; and forming the first and second gate metals comprises forming the first and second gate metals on the third and fourth conductive layers, respectively.

19. The method of claim 17, wherein:

a first transistor comprises the first gate metal and the third conductive layer;

a second transistor comprises the second gate metal and the second and fourth conductive layers; and a first thickness of the third conductive layer of the first transistor is thinner than a combined second thickness of the second and fourth conductive layers of the second transistor.

20. The method of claim 16, wherein forming the first and second gate metals comprises forming the first and second gate metals to be Lanthanum-free and Tantalum Nitride-free.

* * * * *